US012760413B2

(12) United States Patent
Yamaguchi et al.

(10) Patent No.: US 12,760,413 B2
(45) Date of Patent: Oct. 13, 2026

(54) FILM FORMING METHOD, FILM FORMING SYSTEM, AND FILM FORMING APPARATUS

(71) Applicant: TOKYO ELECTRON LIMITED, Tokyo (JP)

(72) Inventors: Katsumasa Yamaguchi, Nirasaki (JP); Koji Maekawa, Nirasaki (JP); Takashi Sameshima, Nirasaki (JP); Shigeru Nakajima, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1020 days.

(21) Appl. No.: 17/255,990

(22) PCT Filed: May 17, 2019

(86) PCT No.: PCT/JP2019/019770
§ 371 (c)(1),
(2) Date: Dec. 23, 2020

(87) PCT Pub. No.: WO2020/003803
PCT Pub. Date: Jan. 2, 2020

(65) Prior Publication Data

US 2021/0115560 A1 Apr. 22, 2021

(30) Foreign Application Priority Data

Jun. 28, 2018 (JP) ................................ 2018-123688

(51) Int. Cl.
*C23C 16/455* (2006.01)
*C23C 16/14* (2006.01)
(Continued)

(52) U.S. Cl.
CPC ........ *C23C 16/45534* (2013.01); *C23C 16/14* (2013.01); *C23C 16/34* (2013.01);
(Continued)

(58) Field of Classification Search
CPC ......... H01L 21/28088; H01L 21/28556; H01L 21/67017; H01L 21/76846;
(Continued)

(56) References Cited

U.S. PATENT DOCUMENTS 6,287,965 B1 * 9/2001 Kang ............... H01L 21/28562
257/E21.171
2009/0325372 A1 * 12/2009 Harada ............ H01L 21/28088
257/E21.177
(Continued)

FOREIGN PATENT DOCUMENTS

JP 2007-9298 A 1/2007
JP 2007-81427 A 3/2007
(Continued)

*Primary Examiner* — Marcos D. Pizarro
(74) *Attorney, Agent, or Firm* — Nath, Goldberg & Meyer; Jerald L. Meyer; Tanya E. Harkins

(57) ABSTRACT

A film forming method includes a step of disposing a substrate on which an insulating film is formed in a processing container and forming a base film by repeatedly supplying a Ti-containing gas, an Al-containing gas, and a reaction gas into the processing container under a decompressed atmosphere; and a step of forming a metal layer made of a metal material on the substrate on which the base film is formed.

16 Claims, 22 Drawing Sheets

(51) Int. Cl.

| | |
|---|---|
| ***C23C 16/34*** | (2006.01) |
| ***C23C 16/40*** | (2006.01) |
| ***H10D 64/01*** | (2025.01) |
| ***H10D 64/66*** | (2025.01) |
| ***H10P 14/43*** | (2026.01) |
| ***H10P 72/00*** | (2026.01) |
| ***H10W 20/00*** | (2026.01) |

(52) U.S. Cl.
CPC ...... *C23C 16/403* (2013.01); *C23C 16/45544* (2013.01); *H10D 64/01318* (2026.01); *H10D 64/667* (2025.01); *H10D 64/669* (2025.01); *H10P 14/43* (2026.01); *H10P 72/0402* (2026.01); *H10W 20/035* (2026.01); *H10W 20/045* (2026.01); *H10W 20/056* (2026.01); *H10W 20/0595* (2026.01)

(58) Field of Classification Search
CPC ......... H01L 21/76876; H01L 21/76877; H01L 29/4966; H10D 64/01318; H10D 64/667; H10D 64/669; H10P 14/43; H10P 72/0402; H10W 20/035; H10W 20/045; H10W 20/056; H10W 20/0595
See application file for complete search history.

(56) References Cited

U.S. PATENT DOCUMENTS

| | | | | |
|---|---|---|---|---|
| 2011/0151660 | A1 | 6/2011 | Harada et al. | |
| 2019/0161853 | A1 * | 5/2019 | Aoyama | ............ C23C 16/0209 |

FOREIGN PATENT DOCUMENTS

| | | | | |
|---|---|---|---|---|
| JP | 2013-213274 | A | 10/2013 | |
| JP | 2014-194081 | A | 10/2014 | |
| JP | 2018-44196 | A | 3/2018 | |
| TW | 201817906 | A | 5/2018 | |
| WO | 2015/080058 | A1 | 6/2015 | |
| WO | WO-2018021014 | A1 * | 2/2018 | ......... C23C 16/0209 |

* cited by examiner

FILM FORMING METHOD, FILM FORMING SYSTEM, AND FILM FORMING APPARATUS

This is a National Phase Application filed under 35 U.S.C. 371 as a national stage of PCT/JP2019/019770, filed May 17, 2019, an application claiming the benefit of Japanese Application No. 2018-123688, filed Jun. 28, 2018, the content of each of which is hereby incorporated by reference in its entirety.

TECHNICAL FIELD

The present disclosure relates to a film forming method, a film forming system, and a film forming apparatus.

BACKGROUND

Patent Document 1 proposes a technique for forming a tungsten film as a metal layer on a substrate by a chemical vapor deposition (CVD) method. In Patent Document 1, a method of forming a TiN film as a barrier layer on a silicon layer and forming the tungsten film on the TiN film is used from the viewpoint of adhesion of the substrate to the silicon laver and suppression of reaction between them. Further, in Patent Document 1, prior to main film formation of the tungsten film, a nucleation step is performed so as to make it easy to form the tungsten film uniformly.

PRIOR ART DOCUMENTS

Patent Document

Japanese laid-open publication No. 2013-213274

The present disclosure provides some embodiments of a technique capable of reducing the resistance of a metal layer even when it is thinned.

SUMMARY

According to one embodiment of the present disclosure, there is provided a film forming method including a step of disposing a substrate on which an insulating film is formed in a processing container and forming a base film by repeatedly supplying a Ti-containing gas, an Al-containing gas, and a reaction gas into the processing container under a decompressed atmosphere, and a step of forming a metal layer made of a metal material on the substrate on which the base film is formed.

According to the present disclosure, it is possible to reduce the resistance of a metal layer even when it is thinned.

DETAILED DESCRIPTION

Hereinafter, embodiments of a film forming method, a film forming system, and a film forming apparatus disclosed in the present disclosure will be described in detail with reference to the drawings. It should be noted that the present embodiments does not limit the disclosed film forming method, film forming system and film forming apparatus.

By the way, when manufacturing LSIs, metal layers are being widely used for MOSFET gate electrodes, contacts with sources and drains, word lines of memories, and the like.

Therefore, when a tungsten film is formed as a metal layer on a substrate by the technique of Patent Document 1, an initial tungsten film produced by a nucleation step (hereinafter also referred to as a "nucleation film") has high resistance. Therefore, when the entire tungsten film is thinned, the tungsten film has high resistance due to the influence of the nucleation film portion.

Wiring is miniaturized in LSI, and low resistance of the wiring is required. Therefore, it is expected that the resistance of the metal layer can be reduced even when the film is thinned. For example, in a three-dimensional laminated semiconductor memory such as a 3D NAND flash memory, a tungsten film is formed as a word line, but further reduction in resistance of the tungsten film is required for miniaturization.

First Embodiment

[System Configuration]

Figure 1:
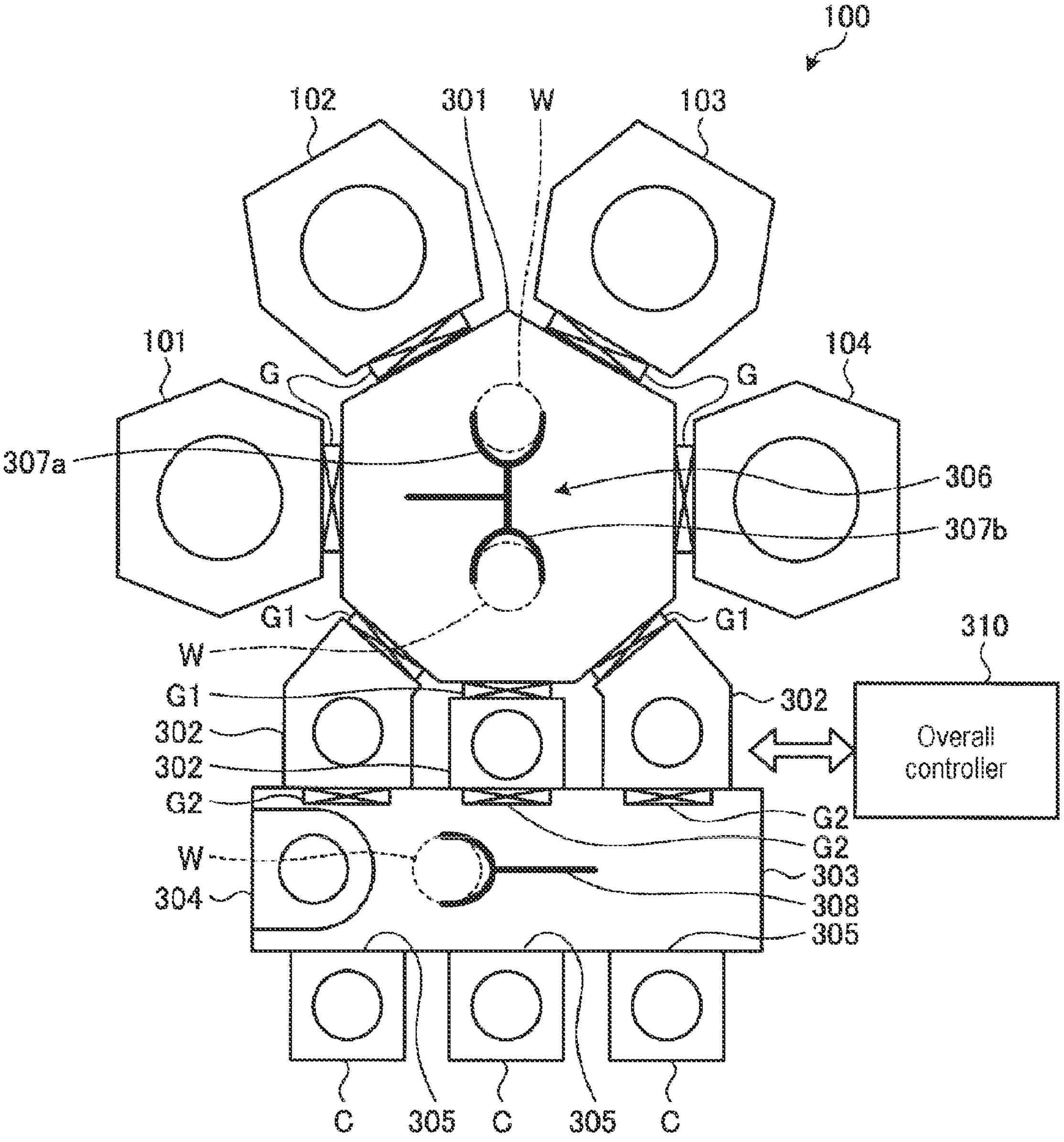
FIG. 1 is a view illustrating an example of an overall schematic configuration of a film forming system according to a first embodiment.

In a first embodiment, a case where film formation is performed by a film forming system using a plurality of film forming apparatuses will be described as an example. First, the film forming system according to this embodiment will be described. FIG. 1 is a view illustrating an example of a schematic configuration of the entire film forming system according to the first embodiment. The film forming system 100 forms abase film on a substrate and then forms a metal layer on the base film. In the following, a case where a tungsten film is formed as a metal layer will be described as an example, but the present disclosure is not limited thereto. The film forming system 100 may form a metal layer containing any one of Cu (copper), Co (cobalt). Ru (ruthenium), and Mo (molybdenum).

As illustrated in FIG. 1, the film forming system 100 has four film forming apparatuses 101 to 104. In the film forming system 100 according to the embodiment, a case where abase film is formed by the film forming apparatus 101, an initial tungsten film is formed by the film forming apparatus 102, and a tungsten film is formed by the film forming apparatuses 103 and 104 in a distributed manner will be described as an example. In the film forming system 100 according to the present embodiment, although the case where the film formation of the base film and the film formation of the initial tungsten film are each carried out by one film forming apparatus and the film formation of the main tungsten film is carried out by two film forming apparatus in a distribution manner will be described as an example, but the present disclosure is not limited thereto. For example, in the film forming system 100, the film formation of the base film may be carried out by two film forming apparatuses in a distributed manner and the film formation of the tungsten film may be carried out by two film forming apparatuses in a distributed manner. In this case, either the film forming apparatus of the base film or the film forming apparatus of the main tungsten film is preferably provided with the film forming function for the initial tungsten film or the film forming function for the nucleation film which is the same function as the initial tungsten film.

A transfer mechanism is connected to the film forming apparatuses 101 to 104, and a target substrate on which a film is to be filmed is transferred by the transfer mechanism. For example, as illustrated in FIG. 1, the film forming apparatuses 101 to 104 are connected to four wall portions of a vacuum transfer chamber 301 having a heptagonal planar shape via gate valves G, respectively. The interior of the vacuum transfer chamber 301 is exhausted by a vacuum pump and is maintained at a predetermined degree of vacuum. That is, the film forming system 100 is a multi-chamber type vacuum processing system and can continuously form a base film and a tungsten film without breaking the vacuum. That is, all the steps performed in processing containers of the film forming apparatuses 101 to 104 are performed without exposing a silicon wafer W (hereinafter referred to as a "wafer W") to the atmosphere.

Three load lock chambers 302 are connected to the other three wall portions of the vacuum transfer chamber 301 via gate valves G1, respectively. An atmospheric transfer chamber 303 is provided on the opposite side of the vacuum transfer chamber 301 with the load lock chambers 302 interposed therebetween. The three load lock chambers 302 are connected to the atmospheric transfer chamber 303 via gate valves G2, respectively. Each of the load lock chambers 302 controls a pressure between the atmospheric pressure and the vacuum when the wafer W is transferred between the atmospheric transfer chamber 303 and the vacuum transfer chamber 301.

Three carrier mounting ports 305 for mounting carriers (FOUPs, etc.) C for accommodating wafers W are provided on the wall portion of the air transfer chamber 303 opposite to the wall portion on which the load lock chambers 302 are mounted. Further, an alignment chamber 304 for aligning the wafers W is provided on a sidewall of the atmospheric transfer chamber 303. A down-flow of clean air is formed in the atmospheric transfer chamber 303.

A transfer mechanism 306 is provided in the vacuum transfer chamber 301. The transfer mechanism 306 transfers the wafer W to/from the film forming apparatuses 101 to 104 and the load lock chambers 302. The transfer mechanism 306 has two transfer arms 307*a* and 307*b* that can move independently.

A transfer mechanism 308 is provided in the atmospheric transfer chamber 303. The transfer mechanism 308 is configured to transfer the wafer W to/from the carriers C, the load lock chambers 302, and the alignment chamber 304.

The film forming system 100 has an overall controller 310. The overall controller 310 is configured as a computer, for example, and includes a main controller such as a CPU, an input device (keyboard, mouse, etc.), an output device (printer, etc.), a display device (display, etc.), and a storage device (storage medium). The main controller controls each component of the film forming apparatuses 101 to 104, an exhaust mechanism, a gas supply mechanism, and the transfer mechanism 306 of the vacuum transfer chamber 301, exhaust mechanisms and gas supply mechanisms of the load lock chambers 302, the transfer mechanism 308 of the atmospheric transfer chamber 303, a drive system of the gate valves G, G1, and G2, and the like. The main controller of the overall controller 310 causes the film forming system 100 to perform a predetermined operation on based on, for example, a processing recipe stored in a storage medium built in the storage device or a storage medium set in the storage device. The overall controller 310 may be a higher-level controller of the controller of each unit such as a controller 6 of the film forming apparatus 101 to be described later.

Next, the operation of the film forming system 100 configured as above will be described. The following processing operation of the film forming system 100 is performed based on the processing recipe stored in the storage medium in the overall controller 310.

First, a wafer W is taken out from a carrier C connected to the atmospheric transfer chamber 303 by the transfer mechanism 308. Further, the wafer W taken out is passed through the alignment chamber 304 and is then loaded into any load lock chamber 302 by opening the gate valve G2 of the load lock chamber 302. Further, after closing the gate valve G2, the interior of the load lock chamber 302 is vacuum-exhausted.

When the load lock chamber 302 reaches a predetermined degree of vacuum, the gate valve G1 is opened, and the wafer W is taken out from the load lock chamber 302 by any of the transfer arms 307*a* and 307*b* of the transfer mechanism 306.

Further, the gate valve G of the film forming apparatus 101 is opened, and the wafer W held by any of the transfer arms 307*a* and 307*b* of the transfer mechanism 306 is loaded into the film forming apparatus 101. Further, the empty transfer arm is returned to the vacuum transfer chamber 301, the gate valve G is closed, and the film forming apparatus 101 performs a film forming process of a base film.

After the film forming process of the base film is completed, the gate valve G of the film forming apparatus 101 is opened, and the wafer W is loaded out by any of the transfer arms 307*a* and 307*b* of the transfer mechanism 306. Further, the film forming apparatus 102 performs a process of forming an initial tungsten film on the wafer W.

After the initial tungsten film forming process is completed, the gate valve G of the film forming apparatus 102 is opened, and the wafer W is loaded out by any of the transfer arms 307*a* and 307*b* of the transfer mechanism 306. Further, either of the film forming apparatus 103 or 104 performs a process of forming a main tungsten film on the wafer W. In the following, a case where the film forming apparatus 103 forms the main tungsten film on the wafer W will be described as an example.

For example, the gate valve G of the film forming apparatus 103 is opened, the wafer W held by any of the transfer arms 307*a* and 307*b* is loaded into the film forming apparatus 103, the empty transfer arm is returned to the vacuum transfer chamber 301, and then the gate valve G is closed. Further, the film forming apparatus 103 performs the process of forming the main tungsten film on the initial tungsten film formed on the wafer W. After the main tungsten film is formed in this way, the gate valve G of the film forming apparatus 103 is opened, and the wafer W is loaded out by any of the transfer arms 307*a* and 307*b* of the transfer mechanism 306. Further, the gate valve G1 of any of the load lock chambers 302 is opened, and the wafer W on the transfer arm is loaded into the load lock chamber 302. Further, the interior of the load lock chamber 302 into which the wafer W is loaded is returned to the atmosphere, the gate valve G2 is opened, and the wafer W in the load lock chamber 302 is returned to the carrier C by the transfer mechanism 308.

The process described as above is performed on a plurality of wafers W simultaneously in parallel to complete a process of forming a tungsten film on a predetermined number of wafers W.

Thus, the film forming system 100 can realize the film formation of the base film and the film formation of the tungsten film with high throughput. The film forming system 100 of this embodiment is shown as a vacuum processing system equipped with four film forming apparatuses, but the number of film forming apparatuses is not limited thereto. The number of film forming apparatuses may be 2, 3, or 4 or more as long as the vacuum processing system can be equipped with a plurality of film forming apparatuses. For example, it may be a vacuum processing system equipped with eight or more film forming apparatuses. Further, the film forming system 100 of this embodiment has been described by taking the case where the vacuum transfer chamber 301 has a heptagonal shape, as an example, but the present disclosure is not limited thereto. The vacuum transfer chamber 301 may have other polygonal shapes such as a pentagon, a hexagon or the like as long as a plurality of film forming apparatuses can be connected to the vacuum transfer chamber 301. Further, the film forming system 100 may be a system in which a plurality of polygonal vacuum transfer chambers is connected.

[Configuration of Film Forming Apparatus]

The film forming apparatus 101 and the film forming apparatuses 102 to 104 according to the first embodiment have substantially the same configurations except for the configuration of the gas supply mechanism for supplying a gas. In the following, the configuration of the film forming apparatus 101 will be mainly described, and different parts of the configurations of the film forming apparatus 102 to 104 will be mainly described.

Figure 2:
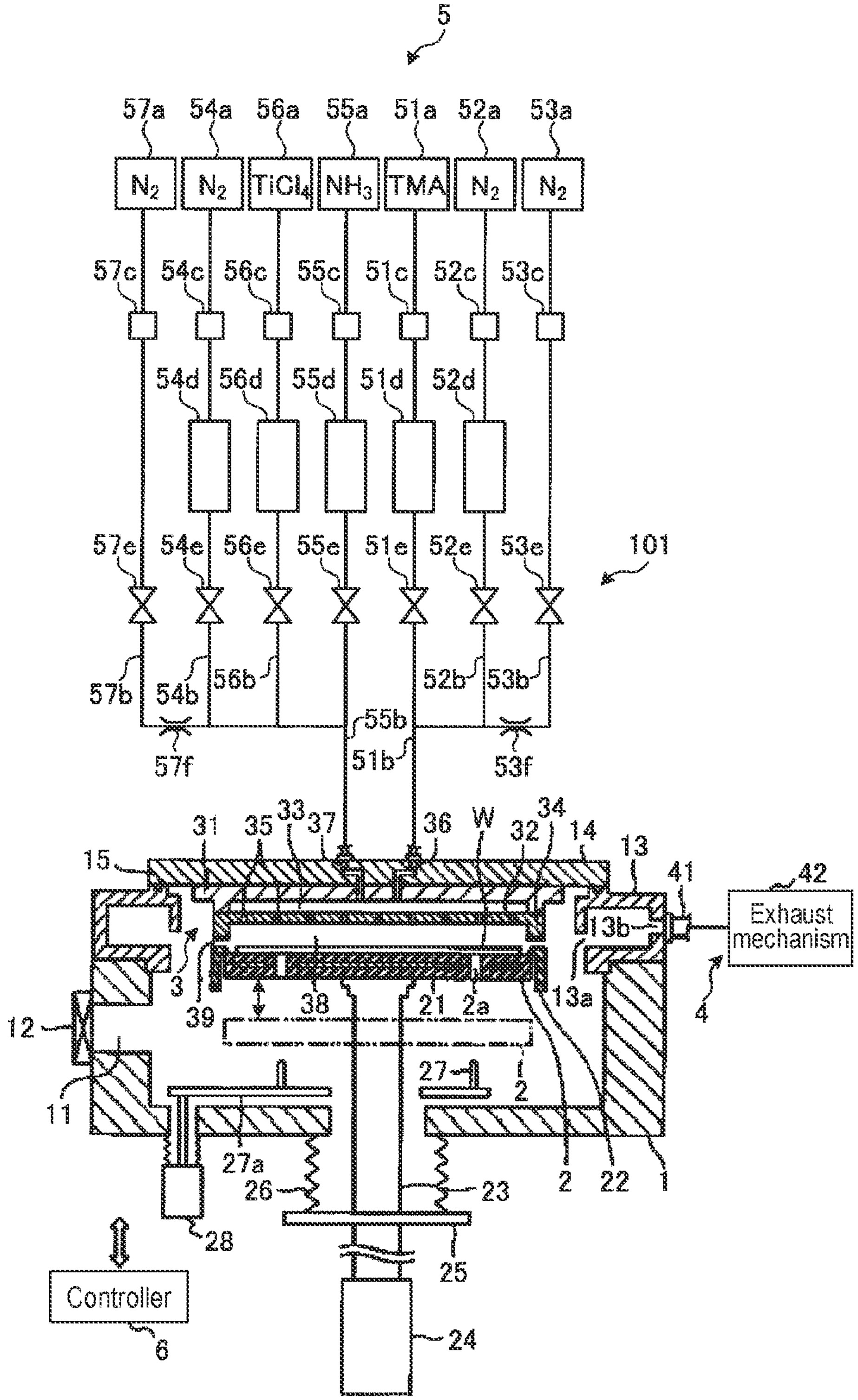
FIG. 2 is a sectional view illustrating an example of a schematic configuration of a film forming apparatus according to the first embodiment.

The configuration of the film forming apparatus 101 according to the first embodiment will be described. FIG. 2 is a sectional view illustrating an example of a schematic configuration of the film forming apparatus 101 according to the first embodiment. The film forming apparatus 101 includes a processing container 1, a stage 2, a shower head 3, an exhaust part 4, a gas supply mechanism 5, and a controller 6.

The processing container 1 is made of metal such as aluminum and has substantially a cylindrical shape. The processing container 1 accommodates a wafer W, which is a target substrate. A loading/unloading port 11 for loading or unloading the wafer W is formed on a sidewall of the processing container 1, and the loading/unloading port 11 is opened and closed by a gate valve 12. An annular exhaust duct 13 having a rectangular cross section is provided on a main body of the processing container 1. A slit 13*a* is formed along the inner peripheral surface of the exhaust duct 13. An exhaust port 13*b* is formed on an outer wall of the exhaust duct 13. A ceiling wall 14 is provided on the upper surface of the exhaust duct 13 so as to close the upper opening of the processing container 1. A space between the exhaust duct 13 and the ceiling wall 14 are hermetically sealed with a seal ring 15.

The stage 2 horizontally supports the wafer W in the processing container 1, the stage 2 is formed in a disc shape having a size corresponding to the wafer W and is supported by a support member 23. The stage 2 is made of a ceramic material such as aluminum nitride (AlN) or a metal material such as aluminum or a nickel alloy, and a heater 21 for heating the wafer W is embedded in the stage 2. The heater 21 generates heat by being supplied with power from a heater power source (not shown). Further, the wafer W is controlled to a predetermined temperature by controlling the output of the heater 21 by a temperature signal of a thermocouple (not shown) provided in the vicinity of the upper surface of the stage 2. The stage 2 is provided with a cover member 22 formed of ceramics such as alumina so as to cover the outer peripheral region and the side surface of the upper surface of the stage 2.

The support member 23 for supporting the stage 2 is provided on the bottom surface of the stage 2. The support member 23 extends from the center of the bottom surface of the stage 2 to the lower side of the processing container 1 through a hole portion formed in a bottom wall of the processing container 1, and the lower end of the support member 23 is connected to the elevating mechanism 24. The stage 2 is moved up and down, via the support member 23, by the elevating mechanism 24 between a processing position shown in FIG. 2 and a transfer position where the wafer W can be transferred, which is indicated by a two-dot chain line below the processing position. A flange portion 25 is attached below the processing container 1 of the support member 23, and a bellows 26 that partitions the internal atmosphere of the processing container 1 from the outside air and expands and contracts according to the moving up/down operation of the stage 2 is provided between the bottom surface of the processing container 1 and the flange portion 25.

Three wafer support pins 27 (only two are shown) are provided in the vicinity of the bottom surface of the processing container 1 so as to protrude upward from an elevating plate 27*a*. The wafer support pins 27 are moved up and down via the elevating plate 27*a* by an elevating mechanism 28 provided below the processing container 1. The wafer support pins 27 are inserted into through-holes 2*a* formed in the stage 2 at the transfer position so as to be protrudable from the upper surface of the stage 2. By moving up and down the wafer support pins 27, the wafer W is delivered between the transfer mechanism (not shown) and the stage 2.

The shower head 3 supplies a processing gas into the processing container 1 in the form of a shower. The shower head 3 is made of metal and has substantially the same diameter as the stage 2. The shower head 3 is disposed so as to face the stage 2. The shower head 3 has a main body 31 fixed to the ceiling wall 14 of the processing container 1, and a shower plate 32 connected under the main body 31. A gas diffusion space 33 is formed between the main body 31 and the shower plate 32, and gas introduction holes 36 and 37 are formed in the gas diffusion space 33 so as to penetrate the ceiling wall 14 of the processing container 1 and the center of the main body 31. An annular protrusion 34 protruding downward is formed on the peripheral edge of the shower plate 32. Gas discharge holes 35 are formed on the flat surface inside the annular protrusion 34. When the stage 2 is present at the processing position, a processing space 38 is formed between the stage 2 and the shower plate 32, and the upper surface of the cover member 22 and the annular protrusion 34 are close to each other to form an annular gap 39.

The exhaust part 4 exhausts the interior of the processing container 1. The exhaust part 4 has an exhaust pipe 41 connected to the exhaust port 13*b*, and an exhaust mechanism 42 having a vacuum pump, a pressure control valve, and the like connected to the exhaust pipe 41. At the time of processing, a gas in the processing container 1 reaches the exhaust duct 13 through the slit 13*a* and is discharged by the exhaust mechanism 42 from the exhaust duct 13 through the exhaust pipe 41.

The gas supply mechanism 5 is connected to the gas introduction holes 36 and 37 and is capable of supplying various gases used for film formation. For example, the gas supply mechanism 5 has an Al-containing gas supply source 51*a*, a $N_2$ gas supply source 52*a*, a $N_2$ gas supply source 53*a*, a $N_2$ gas supply source 54*a*, an $NH_3$ gas supply source 55*a*, a Ti-containing gas supply source 56*a*, and a $N_2$ gas supply source 57*a*, as gas supply sources for forming a base film. In the gas supply mechanism 5 shown in FIG. 2, the gas supply sources are shown separately, but they may be provided in common as long as they can be.

The Al-containing gas supply source 51*a* supplies an Al-containing gas into the processing container 1 via a gas supply line 51*b*. Examples of the Al-containing gas may include an $AlCl_3$ gas and a TMA (trimethylaluminum: $C_6H_{18}Al_2$) gas. For example, the Al-containing gas supply source 51*a* supplies the TMA gas as the Al-containing gas. A flow rate controller 51*c*, a storage tank 51*d*, and a valve 51*e* are interposed in the gas supply line 51*b* from the upstream side. The downstream side of the valve 51*e* of the gas supply line 51*b* is connected to the gas introduction hole 36. The Al-containing gas supplied from the Al-containing gas supply source 51*a* is temporarily stored in the storage tank 51*d* before being supplied into the processing container 1, and is supplied into the processing container 1 after being boosted to a predetermined pressure in the storage tank 51*d*. The supply and stop of the Al-containing gas from the storage tank 51*d* to the processing container 1 is performed by the valve 51*e*. By temporarily storing the Al-containing gas in the storage tank 51*d* in this way, the Al-containing gas can be stably supplied into the processing container 1 at a relatively large flow rate.

The $N_2$ gas supply source 52*a* supplies a $N_2$ gas, which is a purge gas, into the processing container 1 via a gas supply line 52*b*. A flow rate controller 52*c*, a storage tank 52*d*, and a valve 52*e* are interposed in the gas supply line 52*b* from the upstream side. The downstream side of the valve 52*e* of the gas supply line 52*b* is connected to the gas supply line 51*b*. The $N_2$ gas supplied from the $N_2$ gas supply source 52*a* is temporarily stored in the storage tank 52*d* before being supplied into the processing container 1, and is supplied into the processing container 1 after being boosted to a predetermined pressure in the storage tank 52*d*. The supply and stop of the $N_2$ gas from the storage tank 52*d* to the processing container 1 is performed by the valve 52*e*. By temporarily storing the $N_2$ gas in the storage tank 52*d* in this way, the $N_2$ gas can be stably supplied into the processing container 1 at a relatively large flow rate.

The $N_2$ gas supply source 53*a* supplies a $N_2$ gas, which is a carrier gas, into the processing container 1 via a gas supply line 53*b*. A flow rate controller 53*c*, a valve 53*e*, and an orifice 53*f* are interposed in the gas supply line 53*b* from the upstream side. The downstream side of the orifice 53*f* of the gas supply line 53*b* is connected to the gas supply line 51*b*. The $N_2$ gas supplied from the $N_2$ gas supply source 53*a* is continuously supplied into the processing container 1 during the film formation of the wafer W. The supply and stop of the $N_2$ gas from the $N_2$ gas supply source 53*a* to the processing container 1 is performed by the valve 53*e*. The gases are supplied to the gas supply lines 51*b* and 52*b* at a relatively large flow rate by the storage tanks 51*d* and 52*d*, respectively, but the gas supplied to the gas supply line 51*b* is suppressed by the orifice 53*f* from flowing back to the gas supply line 53*b*.

The $N_2$ gas supply source 54*a* supplies a $N_2$ gas, which is a purge gas, into the processing container 1 via a gas supply line 54*b*. A flow rate controller 54*c*, a storage tank 54*d*, and a valve 54*e* are interposed in the gas supply line 54*b* from the upstream side. The downstream side of the valve 54*e* of the gas supply line 54*b* is connected to a gas supply line 55*b*. The $N_2$ gas supplied from the $N_2$ gas supply source 54*a* is temporarily stored in the storage tank 54*d* before being supplied into the processing container 1, and is supplied into the processing container 1 after being boosted to a predetermined pressure in the storage tank 54*d*. The supply and stop of the $N_2$ gas from the storage tank 54*d* to the processing container 1 is performed by the valve 54*e*. By temporarily storing the $N_2$ gas in the storage tank 54*d* in this way, the $N_2$ gas can be stably supplied into the processing container 1 at a relatively large flow rate.

The $NH_3$ gas supply source 55*a* supplies a reaction gas into the processing container 1 via the gas supply line 55*b*. Examples of the reaction gas may include a N-containing gas, a rare gas, and an inert gas. Examples of the N-containing gas that can be used as the reaction gas may include an ammonia gas (an $NH_3$ gas) and a hydrazine ($N_2H_4$) gas. For example, the $NH_3$ gas supply source 55*a* supplies the $NH_3$ gas into the processing container 1 as the reaction gas. A flow rate controller 55*c*, a storage tank 55*d*, and a valve 55*e* are interposed in the gas supply line 55*b* from the upstream side. The downstream side of the valve 55*e* of the gas supply line 55*b* is connected to the gas introduction hole 37. The $NH_3$ gas supplied from the $NH_3$ gas supply source 55*a* is temporarily stored in the storage tank 55*d* before being supplied into the processing container 1, and is supplied into the processing container 1 after being boosted to a predetermined pressure in the storage tank 55*d*. The supply and stop of the $NH_3$ gas from the storage tank 55*d* to the processing container 1 is performed by the valve 55*e*. By temporarily storing the $NH_3$ gas in the storage tank 55*d* in this way, the $NH_3$ gas can be stably supplied into the processing container 1 at a relatively large flow rate.

The Ti-containing gas supply source 56*a* supplies a Ti-containing gas into the processing container 1 via a gas supply line 56*b*. Examples of the Ti-containing gas may include a $TiCl_4$ gas, a TDMAT (tetrakis(dimethylamino) titanium: $Ti[N(CH_3)_2]_4$) gas, and a TMEAT (tetrakis(methylethylamino)titanium: $C_{12}H_{32}N_4Ti$) gas. For example, the Ti-containing gas supply source 56*a* supplies the $TiCl_4$ gas as the Ti-containing gas. A flow rate controller 56*c*, a storage tank 56*d*, and a valve 56*e* are interposed in the gas supply line 56*b* from the upstream side. The downstream side of the valve 56*e* of the gas supply line 56*b* is connected to the gas supply line 55*b*. The Ti-containing gas supplied from the Ti-containing gas supply source 56*a* is temporarily stored in the storage tank 56*d* before being supplied into the processing container 1, and is supplied into the processing container 1 after being boosted to a predetermined pressure in the storage tank 56*d*. The supply and stop of the Ti-containing gas from the storage tank 56*d* to the processing container 1 is performed by the valve 56*e*. By temporarily storing the Ti-containing gas in the storage tank 56*d* in this way, the Ti-containing gas can be stably supplied into the processing container 1 at a relatively large flow rate.

The $N_2$ gas supply source 57*a* supplies a $N_2$ gas, which is a carrier gas, into the processing container 1 via a gas supply line 57*b*. A flow rate controller 57*c*, a valve 57*e*, and an orifice 57*f* are interposed in the gas supply line 57*b* from the upstream side. The downstream side of the orifice 57*f* of the gas supply line 57*b* is connected to the gas supply line 55*b*. The $N_2$ gas supplied from the $N_2$ gas supply source 57*a* is continuously supplied into the processing container 1 during the film formation of the wafer W. The supply and stop of the $N_2$ gas from the $N_2$ gas supply source 57*a* to the processing container 1 is performed by the valve 57*e*. The gases are supplied to the gas supply lines 55*b* and 56*b* at a relatively large flow rate by the storage tanks 55*d* and 56*d*, respectively, but the gas supplied to the gas supply line 55*b* is suppressed by the orifice 57*f* from flowing back to the gas supply line 57*b*.

The operation of the film forming apparatus 101 configured as above is collectively controlled by the controller 6. The controller 6 is, for example, a computer and includes a CPU (Central Processing Unit), a RAM (Random Access Memory), a ROM (Read Only Memory), an auxiliary storage device, and the like. The CPU operates based on a program stored in the ROM or the auxiliary storage device and controls the overall operation of the apparatus. The controller 6 may be provided inside the film forming apparatus 101, or may be provided externally. When the controller 6 is provided externally, the controller 6 can control the film forming apparatus 101 by a wired or wireless communication means.

Figure 3:
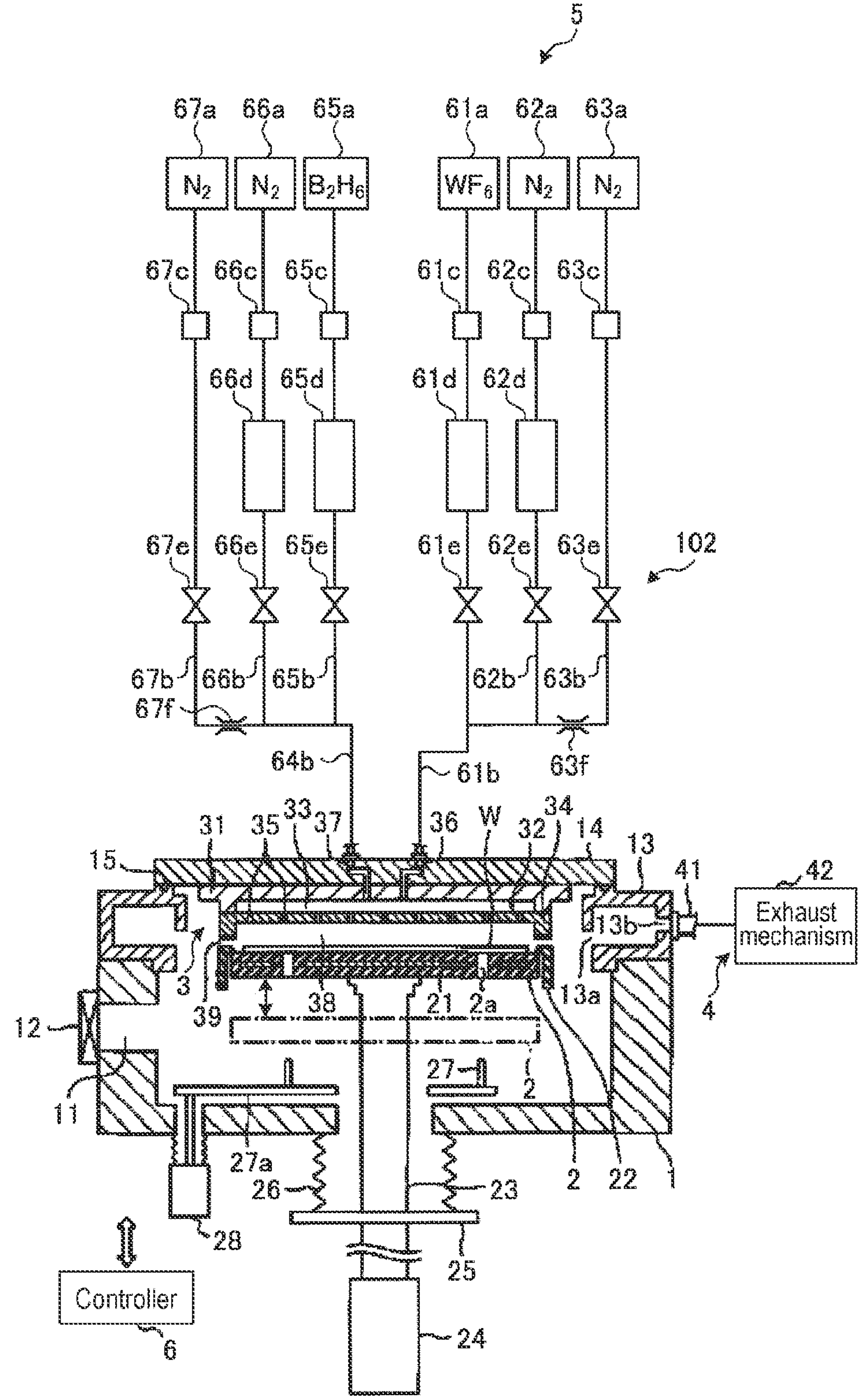
FIG. 3 is a sectional view illustrating an example of a schematic configuration of the film forming apparatus according to the first embodiment.

Next, the configuration of the film forming apparatus 102 according to the first embodiment will be described. FIG. 3 is a sectional view illustrating an example of a schematic configuration of the film forming apparatus 102 according to the first embodiment.

The film forming apparatus 102 has the same configuration as the film forming apparatus 101 illustrated in FIG. 2 except for the gases used and the gas supply mechanism 5 for supplying the gases. The same parts of the film forming apparatus 102 as the film forming apparatus 101 are denoted by the same reference numerals, explanation thereof will not be repeated, and the differences will be mainly described.

The gas supply mechanism 5 is connected to the gas introduction holes 36 and 37 and is capable of supplying various gases used for film formation. For example, the gas supply mechanism 5 has a $WF_6$ gas supply source 61*a*, a $N_2$ gas supply source 62*a*, a $N_2$ gas supply source 63*a*, a $B_2H_6$ gas supply source 65*a*, a $N_2$ gas supply source 66*a*, and a $N_2$ gas supply source 67*a*, as gas supply sources for forming an initial tungsten film. In the gas supply mechanism 5 shown in FIG. 3, the gas supply sources are shown separately, but they may be provided in common as long as they can be.

The $WF_6$ gas supply source 61*a* supplies a $WF_6$ gas into the processing container 1 via a gas supply line 61*b*. A flow rate controller 61*c*, a storage tank 61*d*, and a valve 61*e* are interposed in the gas supply line 61*b* from the upstream side. The downstream side of the valve 61*e* of the gas supply line 61*b* is connected to the gas introduction hole 36. The $WF_6$ gas supplied from the $WF_6$ gas supply source 61*a* is temporarily stored in the storage tank 61*d* before being supplied into the processing container 1, and is supplied into the processing container 1 after being boosted to a predetermined pressure in the storage tank 61*d*. The supply and stop of the $WF_6$ gas from the storage tank 61*d* to the processing container 1 is performed by the valve 61*e*. By temporarily storing the $WF_6$ gas in the storage tank 61*d* in this way, the $WF_6$ gas can be stably supplied into the processing container 1 at a relatively large flow rate.

The $N_2$ gas supply source 62*a* supplies a $N_2$ gas, which is a purge gas, into the processing container 1 via a gas supply line 62*b*. A flow rate controller 62*c*, a storage tank 62*d*, and a valve 62*e* are interposed in the gas supply line 62*b* from the upstream side. The downstream side of the valve 62*e* of the gas supply line 62*b* is connected to the gas supply line 61*b*. The $N_2$ gas supplied from the $N_2$ gas supply source 62*a* is temporarily stored in the storage tank 62*d* before being supplied into the processing container 1, and is supplied into the processing container 1 after being boosted to a predetermined pressure in the storage tank 62*d*. The supply and stop of the $N_2$ gas from the storage tank 62*d* to the processing container 1 is performed by the valve 62*e*. By temporarily storing the $N_2$ gas in the storage tank 62*d* in this way, the $N_2$ gas can be stably supplied into the processing container 1 at a relatively large flow rate.

The $N_2$ gas supply source 63*a* supplies a $N_2$ gas, which is a carrier gas, into the processing container 1 via a gas supply line 63*b*. A flow rate controller 63*c*, a valve 63*e*, and an orifice 63*f* are interposed in the gas supply line 63*b* from the upstream side. The downstream side of the orifice 63*f* of the gas supply line 63*b* is connected to the gas supply line 61*b*. The $N_2$ gas supplied from the $N_2$ gas supply source 63*a* is continuously supplied into the processing container 1 during the film formation of the wafer W. The supply and stop of the $N_2$ gas from the $N_2$ gas supply source 63*a* to the processing container 1 is performed by the valve 63*e*. The gases are supplied to the gas supply lines 61*b* and 62*b* at a relatively large flow rate by the storage tanks 61*d* and 62*d*, respectively, but the gas supplied to the gas supply lines 61*b* and 62*b* is suppressed by the orifice 63*f* from flowing back to the gas supply line 63*b*.

The $B_2H_6$ gas supply source 65*a* supplies a $B_2H_6$ gas, which is a reducing gas, into the processing container 1 via a gas supply line 65*b*. A flow rate controller 65*c*, a storage tank 65*d*, and a valve 65*e* are interposed in the gas supply line 65*b* from the upstream side. The downstream side of the valve 65*e* of the gas supply line 65*b* is connected to a gas supply line 64*b*. The downstream side of the gas supply line 64*b* is connected to the gas introduction hole 37. The $B_2H_6$ gas supplied from the $B_2H_6$ gas supply source 65*a* is temporarily stored in the storage tank 65*d* before being supplied into the processing container 1, and is supplied into the processing container 1 after being boosted to a predetermined pressure in the storage tank 65*d*. The supply and stop of the $B_2H_6$ gas from the storage tank 65*d* to the processing container 1 is performed by the valve 65*e*. By temporarily storing the $B_2H_6$ gas in the storage tank 65*d* in this way, the $B_2H_6$ gas can be stably supplied into the processing container 1 at a relatively large flow rate.

The $N_2$ gas supply source 66*a* supplies a $N_2$ gas, which is a purge gas, into the processing container 1 via a gas supply line 66*b*. A flow rate controller 66*c*, a storage tank 66*d*, and a valve 66*e* are interposed in the gas supply line 66*b* from the upstream side. The downstream side of the valve 66*e* of the gas supply line 66*b* is connected to the gas supply line 64*b*. The $N_2$ gas supplied from the $N_2$ gas supply source 66*a* is temporarily stored in the storage tank 66*d* before being supplied into the processing container 1, and is supplied into the processing container 1 after being boosted to a predetermined pressure in the storage tank 66*d*. The supply and stop of the $N_2$ gas from the storage tank 66*d* to the processing container 1 is performed by the valve 66*e*. By temporarily storing the $N_2$ gas in the storage tank 66*d* in this way, the $N_2$ gas can be stably supplied into the processing container 1 at a relatively large flow rate.

The $N_2$ gas supply source 67*a* supplies a $N_2$ gas, which is a carrier gas, into the processing container 1 via a gas supply line 67*b*. A flow rate controller 67*c*, a valve 67*e*, and an orifice 67*f* are interposed in the gas supply line 67*b* from the upstream side. The downstream side of the orifice 67*f* of the gas supply line 67*b* is connected to the gas supply line 64*b*. The $N_2$ gas supplied from the $N_2$ gas supply source 67*a* is continuously supplied into the processing container 1 during the film formation of the wafer W. The supply and stop of the $N_2$ gas from the $N_2$ gas supply source 67*a* to the processing container 1 is performed by the valve 67*e*. The gases are supplied to the gas supply lines 65*b* and 66*b* at a relatively large flow rate by the storage tanks 65*d* and 66*d*, respectively, but the gas supplied to the gas supply lines 65*b* and 66*b* is suppressed by the orifice 67*f* from flowing back to the gas supply line 67*b*.

Figure 4:
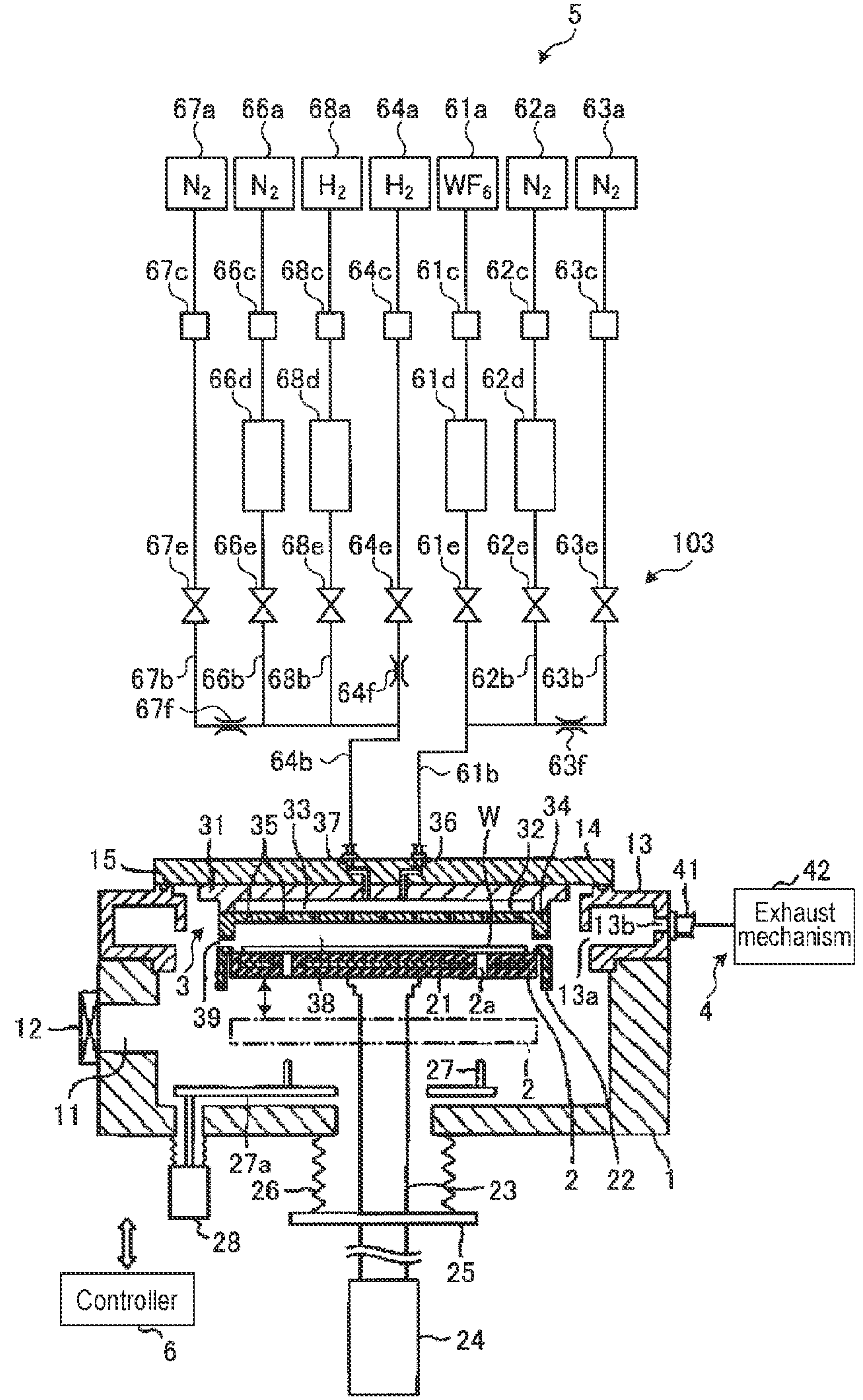
FIG. 4 is a sectional view illustrating an example of a schematic configuration of the film forming apparatus according to the first embodiment.

Next, the configurations of the film forming apparatuses 103 and 104 according to the first embodiment will be described. Since the film forming apparatuses 103 and 104 according to the first embodiment have substantially the same configuration, the configuration of the film forming apparatus 103 will be described as a representative. FIG. 4 is a sectional view illustrating an example of a schematic configuration of the film forming apparatus 103 according to the first embodiment. The film forming apparatus 103 has the same configuration as the film forming apparatuses 101 and 102 shown in FIGS. 2 and 3 except for the gases used and the gas supply mechanism 5 for supplying the gases. The same parts of the film forming apparatus 103 as the film forming apparatuses 101 and 102 are denoted by the same reference numerals, explanation thereof will not be repeated, and the differences will be mainly described.

The gas supply mechanism 5 is connected to the gas introduction holes 36 and 37 and is capable of supplying various gases used for film formation. For example, the gas supply mechanism 5 uses a $WF_6$ gas supply source 61*a*, a $N_2$ gas supply source 62*a*, a $N_2$ gas supply source 63*a*, a $H_2$ gas supply source 64*a*, and a $N_2$ gas supply source 66*a*, a $N_2$ gas supply source 67*a*, and a $H_2$ gas supply source 68*a*, as gas supply sources for forming a tungsten film. In the gas supply mechanism 5 shown in FIG. 4, the gas supply sources are shown separately, but they may be provided in common as long as they can be.

The $WF_6$ gas supply source 61*a* supplies a $WF_6$ gas into the processing container 1 via the gas supply line 61*b*. A flow rate controller 61*c*, a storage tank 61*d*, and a valve 61*e* are interposed in the gas supply line 61*b* from the upstream side. The downstream side of the valve 61*e* of the gas supply line 61*b* is connected to the gas introduction hole 36. The $WF_6$ gas supplied from the $WF_6$ gas supply source 61*a* is temporarily stored in the storage tank 61*d* before being supplied into the processing container 1, and is supplied into the processing container 1 after being boosted to a predetermined pressure in the storage tank 61*d*. The supply and stop of the $WF_6$ gas from the storage tank 61*d* to the processing container 1 is performed by the valve 61*e*. By temporarily storing the $WF_6$ gas in the storage tank 61*d* in this way, the $WF_6$ gas can be stably supplied into the processing container 1 at a relatively large flow rate.

The $N_2$ gas supply source 62*a* supplies a $N_2$ gas, which is a purge gas, into the processing container 1 via the gas supply line 62*b*. A flow rate controller 62*c*, a storage tank 62*d*, and a valve 62*e* are interposed in the gas supply line 62*b* from the upstream side. The downstream side of the valve 62*e* of the gas supply line 62*b* is connected to the gas supply line 61*b*. The $N_2$ gas supplied from the $N_2$ gas supply source 62*a* is temporarily stored in the storage tank 62*d* before being supplied into the processing container 1, and is supplied into the processing container 1 after being boosted to a predetermined pressure in the storage tank 62*d*. The supply and stop of the $N_2$ gas from the storage tank 62*d* to the processing container 1 is performed by the valve 62*e*. By temporarily storing the $N_2$ gas in the storage tank 62*d* in this way, the $N_2$ gas can be stably supplied into the processing container 1 at a relatively large flow rate.

The $N_2$ gas supply source 63*a* supplies a $N_2$ gas, which is a carrier gas, into the processing container 1 via the gas supply line 63*b*. A flow rate controller 63*c*, a valve 63*e*, and an orifice 63*f* are interposed in the gas supply line 63*b* from the upstream side. The downstream side of the orifice 63*f* of the gas supply line 63*b* is connected to the gas supply line 61*b*. The $N_2$ gas supplied from the $N_2$ gas supply source 63*a* is continuously supplied into the processing container 1 during the film formation of the wafer W. The supply and stop of the $N_2$ gas from the $N_2$ gas supply source 63*a* to the processing container 1 is performed by the valve 63*e*. The gases are supplied to the gas supply lines 61*b* and 62*b* at a relatively large flow rate by the storage tanks 61*d* and 62*d*, respectively, but the gas supplied to the gas supply lines 61*b* and 62*b* is suppressed by the orifice 63*f* from flowing back to the gas supply line 63*b*.

The $H_2$ gas supply source 64*a* supplies a $H_2$ gas, which is a reducing gas, into the processing container 1 via the gas supply line 64*b*. A flow rate controller 64*c*, a valve 64*e*, and an orifice 64*f* are interposed in the gas supply line 64*b* from the upstream side. The downstream side of the orifice 64*f* of the gas supply line 64*b* is connected to the gas introduction hole 37. The $H_2$ gas supplied from the $H_2$ gas supply source 64*a* is continuously supplied into the processing container 1 during the film formation of the wafer W. The supply and stop of the $H_2$ gas from the $H_2$ gas supply source 64*a* to the processing container 1 is performed by the valve 64*e*. The gases are supplied to the gas supply lines 66*b* and 68*b* at a relatively large flow rate by the storage tanks 66*d* and 68*d* to be described later, respectively, but the gas supplied to the gas supply lines 66*b* and 68*b* is suppressed by the orifice 64*f* from flowing back to the gas supply line 64*b*.

The $H_2$ gas supply source 68*a* supplies a $H_2$ gas, which is a reducing gas, into the processing container 1 via the gas supply line 68*b*. A flow rate controller 68*c*, a storage tank 68*d*, and a valve 68*e* are interposed in the gas supply line 68*b* from the upstream side. The downstream side of the valve 68*e* of the gas supply line 68*b* is connected to the gas supply line 64*b*. The $H_2$ gas supplied from the $H_2$ gas supply source 68*a* is temporarily stored in the storage tank 68*d* before being supplied into the processing container 1, and is supplied into the processing container 1 after being boosted to a predetermined pressure in the storage tank 68*d*. The supply and stop of the $H_2$ gas from the storage tank 68*d* to the processing container 1 is performed by the valve 68*e*. By temporarily storing the $H_2$ gas in the storage tank 68*d* in this way, the $H_2$ gas can be stably supplied into the processing container 1 at a relatively large flow rate.

The $N_2$ gas supply source 66*a* supplies a $N_2$ gas, which is a purge gas, into the processing container 1 via the gas supply line 66*b*. A flow rate controller 66*c*, a storage tank 66*d*, and a valve 66*e* are interposed in the gas supply line 66*b* from the upstream side. The downstream side of the valve 66*e* of the gas supply line 66*b* is connected to the gas supply line 64*b*. The $N_2$ gas supplied from the $N_2$ gas supply source 66*a* is temporarily stored in the storage tank 66*d* before being supplied into the processing container 1, and is supplied into the processing container 1 after being boosted to a predetermined pressure in the storage tank 66*d*. The supply and stop of the $N_2$ gas from the storage tank 66*d* to the processing container 1 is performed by the valve 66*e*. By temporarily storing the $N_2$ gas in the storage tank 66*d* in this way, the $N_2$ gas can be stably supplied into the processing container 1 at a relatively large flow rate.

The $N_2$ gas supply source 67*a* supplies a $N_2$ gas, which is a carrier gas, into the processing container 1 via the gas supply line 67*b*. A flow rate controller 67*c*, a valve 67*e*, and an orifice 67*f* are interposed in the gas supply line 67*b* from the upstream side. The downstream side of the orifice 67*f* of the gas supply line 67*b* is connected to the gas supply line 64*b*. The $N_2$ gas supplied from the $N_2$ gas supply source 67*a* is continuously supplied into the processing container 1 during the film formation of the wafer W. The supply and stop of the $N_2$ gas from the $N_2$ gas supply source 67*a* to the processing container 1 is performed by the valve 67*e*. The gases are supplied to the gas supply lines 66*b* and 68*b* at a relatively large flow rate by the storage tanks 66*d* and 68*d*, respectively, but the gas supplied to the gas supply lines 66*b* and 68*b* is suppressed by the orifice 67*f* from flowing back to the gas supply line 67*b*.

[Film Forming Method]

Figure 5:
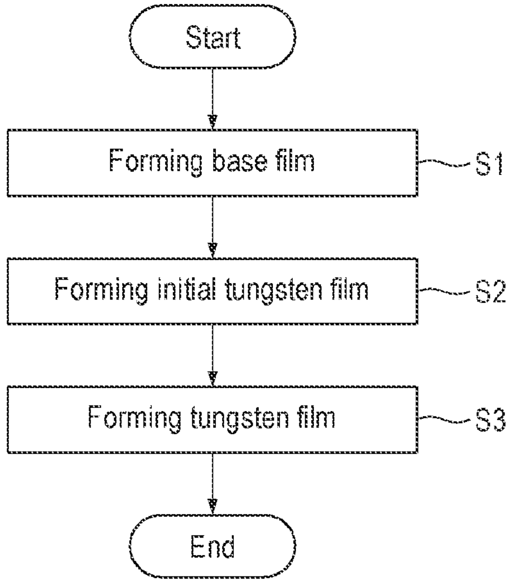
FIG. 5 is a flow chart illustrating an example of flow of each step of a film forming method according to the first embodiment.

Next, a method for forming a tungsten film, which is performed using the film forming system 100 configured as above, will be described. FIG. 5 is a flow chart illustrating an example of flow of each step of a film forming method according to the first embodiment. FIGS. 6A to 6D are sectional views schematically illustrating a state of a wafer in each step of the film forming method according to the first embodiment.

In the film forming method according to the present embodiment, first, a wafer W (FIG. 6A) on which an insulating film is formed is prepared. For example, a wafer W (FIG. 6A) on which a silicon film having a recess such as a trench or a hole is formed is prepared. An AlO layer is formed as an insulating film on the surface of the wafer W. The insulating film may be a $SiO_2$ layer or a SiN layer. Although a recess such as a trench or a hole (contact hole or via hole) is actually formed on the wafer W, the recess is omitted in FIGS. 6A to 6D for the sake of convenience.

Figure 6A:
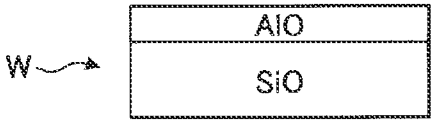
FIGS. 6A to 6D are sectional views schematically illustrating a state of a wafer in each step of the film forming method according to the first embodiment.
Figure 6B:
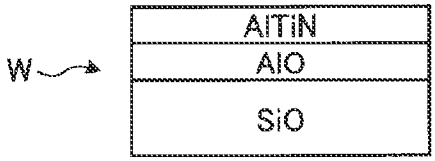

The film forming apparatus 101 forms a base film on the wafer W by an ALD (Atomic Layer Deposition) method (step S1 in FIG. 6B). For example, the film forming apparatus 101 repeatedly supplies a Ti-containing gas, an Al-containing gas, and a reaction gas into the processing container 1 to form a base film. The details of a process of forming the base film will be described later.

Figure 6C:
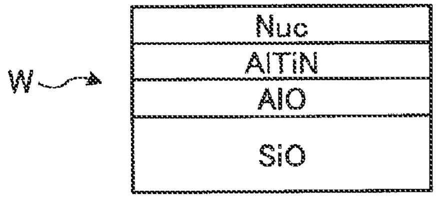

The film forming apparatus 102 alternately supplies a $WF_6$ gas and a $B_2H_6$ gas into the processing container 1 with a supply of a $N_2$ gas, which is a purge gas, interposed between the supplies of $WF_6$ gas and the $B_2H_6$ gas to form a nucleation film as an initial tungsten film for generating tungsten nuclei on the surface of the wafer W (step S2 in FIG. 6C). The step S2 may be a step in which the film forming apparatus 102 supplies the $B_2H_6$ gas into the processing container 1 for a predetermined time or intermittently to treat the surface of the wafer W.

Figure 6D:
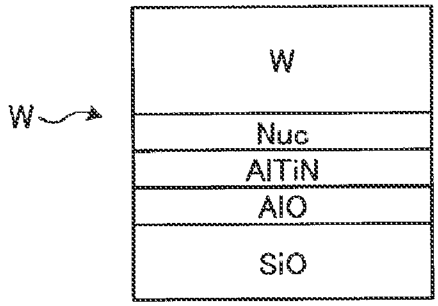

The film forming apparatus 103 forms a tungsten film on the wafer W (step S3 in FIG. 6D). The details of a process of forming the tungsten film will be described later.

As described above, the film forming system 100 performs each step of the film forming method shown in steps S1 to S3 to form the base film and the metal layer (the nucleation film, the tungsten film) on the wafer W on which the insulating film is formed, in order. Hereinafter, the details of the film forming method of each step of steps S1 to S3 will be described.

[Base Film Formation]

Next, a flow in which the film forming apparatus 101 forms a base film will be described. The film forming apparatus 101 repeatedly supplies a Ti-containing gas, an Al-containing gas, and a reaction gas into the processing container 1 to form the base film. For example, the film forming apparatus 101 forms the base film by repeating, at least once, a step of forming a first base film by repeating, at least once, the alternating supply of Ti-containing gas and reaction gas with a purge step interposed therebetween and a step of forming a second base film by repeating, at least once, the alternating supply of Al-containing gas and reaction gas with a purge step interposed therebetween. In the present embodiment, an AlTiN film obtained by laminating a TiN film as the first base film and an AlN film as the second base film is formed as the base film.

Figure 7:
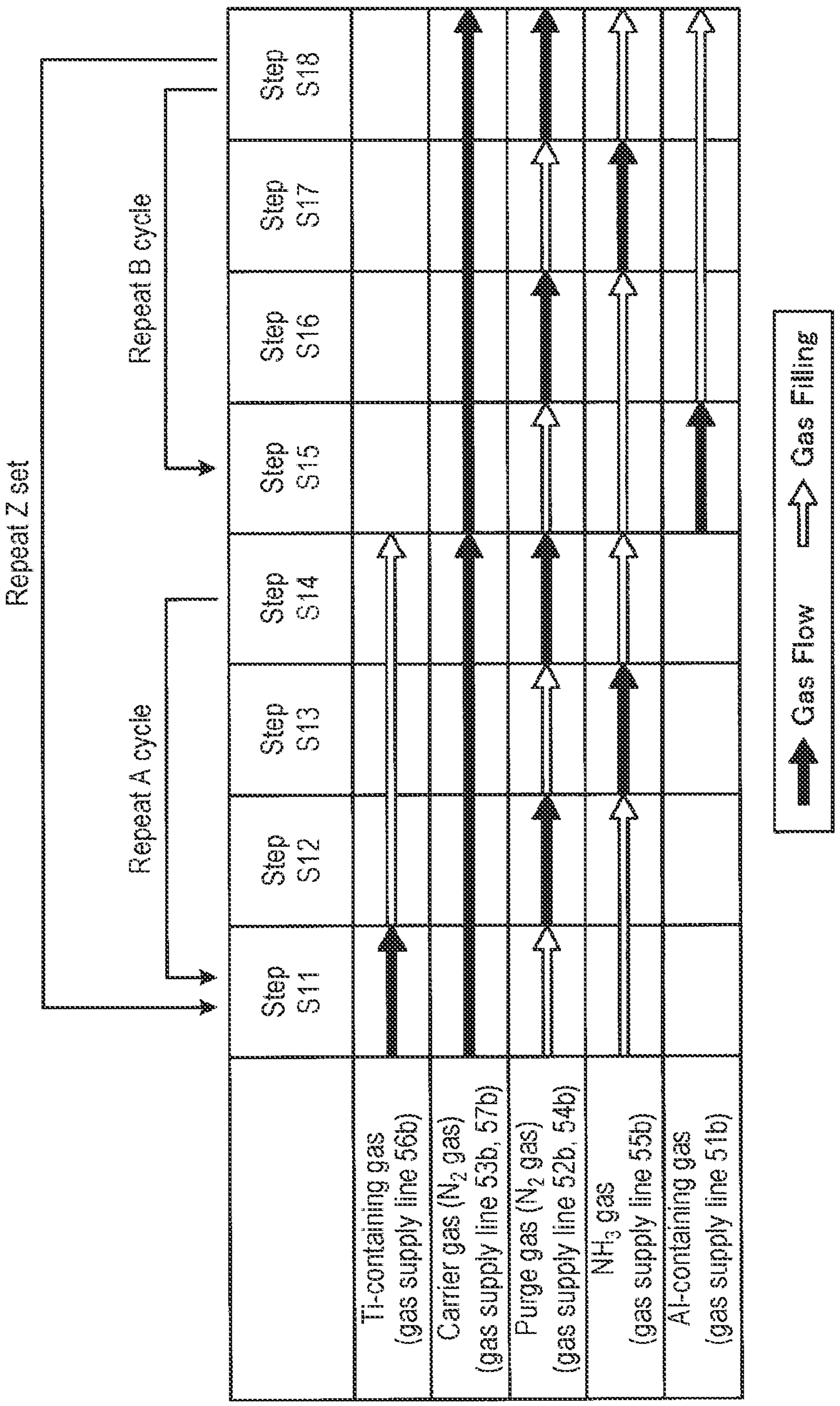
FIG. 7 is a view illustrating an example of a gas supply sequence when forming a base film according to the first embodiment.

FIG. 7 is a view illustrating an example of a gas supply sequence when forming the base film according to the first embodiment. The controller 6 of the film forming apparatus 101 controls the heater 21 of the stage 2 to heat the wafer W to a predetermined temperature (for example, 250 to 550 degrees C.). Further, the controller 6 controls the pressure control valve of the exhaust mechanism 42 to adjust the interior of the processing container 1 to a predetermined pressure (for example, 0.1 to 10 Torr).

The controller 6 opens the valves 53*e* and 57*e* to supply a predetermined flow rate of carrier gas ($N_2$ gas) from the $N_2$ gas supply sources 53*a* and 57*a* to the gas supply lines 53*b* and 57*b*, respectively. Further, the controller 6 supplies a $N_2$ gas, an $NH_3$ gas, and a Ti-containing gas from the $N_2$ gas supply sources 52*a* and 54*a*, the $NH_3$ gas supply source 55*a*, and the Ti-containing gas supply source 56*a* to the gas supply lines 52*b*, 54*b*, 55*b*, and 56*b*, respectively. At this time, since the valves 52*e*, 54*e*, 55*e*, and 56*e* are closed, the $N_2$ gas, the $NH_3$ gas, and the Ti-containing gas are stored in the storage tanks 52*d*, 54*d*, 55*d*, and 56*d*, respectively, and the internal pressures of the storage tanks 51*d*, 55*d*, and 56*d* are increased.

The controller 6 opens the valve 56*e* to supply the Ti-containing gas stored in the storage tank 56*d* into the processing container 1 and adsorb a film by the Ti-containing gas on the surface of the wafer W (step S11). For example, when a $TiCl_4$ gas is used as the Ti-containing gas, TiN is adsorbed on the surface of the wafer W by reaction of $TiCl_4+NH_3 \rightarrow TiN+HCl\uparrow$. Further, for example, when a TDMAT gas is used as the Ti-containing gas, TiN is adsorbed on the surface of the wafer W by reaction of $(Ti[N(CH_3)_2]_4)+NH_3 \rightarrow TiN+C_xH_y\uparrow$. Further, for example, when a TMEAT gas is used as the Ti-containing gas, TiN is adsorbed on the surface of the wafer W by reaction of $C_{12}H_{32}N_4Ti+NH_3 \rightarrow TiN+C_xH_y\uparrow$.

With the lapse of a predetermined time (for example, 0.05 to 5 seconds) from the open of the valve 56*e*, the controller 6 closes the valve 56*e* to stop the supply of the Ti-containing gas into the processing container 1. Further, the controller 6 opens the valves 52*e* and 54*e* to supply the $N_2$ gas stored in the storage tanks 52*d* and 54*d* into the processing container 1, as a purge gas (step S12). At this time, since the $N_2$ gas is supplied from the storage tanks 52*d* and 54*d* in a state where the pressure is increased, the purge gas is supplied into the processing container 1 at a relatively large flow rate, for example, a flow rate larger than the flow rate of the carrier gas. Therefore, the Ti-containing gas remaining in the processing container 1 is quickly discharged to the exhaust pipe 41, so that the interior of the processing container 1 is replaced with the $N_2$ gas atmosphere from the Ti-containing gas atmosphere in a short time. Further, since the valve 56*e* is closed, the Ti-containing gas supplied from the Ti-containing gas supply source 56*a* to the gas supply line 56*b* is stored in the storage tank 56*d*, and the internal pressure of the storage tank 56*d* is increased. Further, since the valve 56*e* is closed, the carrier gas ($N_2$) supplied from the gas supply line 53*b* and the gas supply line 57*b* also functions as a purge gas to be able to discharge the excess Ti-containing gas.

With the lapse of a predetermined time (for example, 0.05 to 5 seconds) from the open of the valves 52*e* and 54*e*, the controller 6 closes the valves 52*e* and 54*e* to stop the supply of the purge gas into the processing container 1. Further, the controller 6 opens the valve 55*e* to supply the $NH_3$ gas stored in the storage tank 55*d* into the processing container 1 to reduce the Ti-containing gas adsorbed on the surface of the wafer W (step S13).

With the lapse of a predetermined time (for example, 0.05 to 5 seconds) from the open of the valve 55*e*, the controller 6 closes the valve 55*e* to stop the supply of the $NH_3$ gas into the processing container 1. Further, the controller 6 opens the valves 52*e* and 54*e* to supply the $N_2$ gas stored in the storage tanks 52*d* and 54*d* into the processing container 1, as a purge gas (step S14). At this time, since the $N_2$ gas is supplied from the storage tanks 52*d* and 54*d* in a state where the pressure is increased, the purge gas is supplied into the processing container 1 at a relatively large flow rate, for example, a flow rate larger than the flow rate of the carrier gas. Therefore, the $NH_3$ gas remaining in the processing container 1 is quickly discharged to the exhaust pipe 41, so that the interior of the processing container 1 is replaced with the $N_2$ gas atmosphere from the $NH_3$ gas atmosphere in a short time. Further, since the valve 55*e* is closed, the $NH_3$ gas supplied from the $NH_3$ gas supply source 55*a* to the gas supply line 55*b* is stored in the storage tank 55*d*, and the internal pressure of the storage tank 55*d* is increased. Further, since the valve 55*e* is closed, the carrier gas ($N_2$) supplied from the gas supply line 53*b* and the gas supply line 57*b* also functions as a purge gas to be able to discharge the excess $NH_3$ gas.

An A cycle of steps S11 to S14 corresponds to the step of forming the first base film.

The controller 6 opens the valves 53*e* and 57*e* to supply a predetermined flow rate of carrier gas ($N_2$ gas) from the $N_2$ gas supply sources 53*a* and 57*a* to the gas supply lines 53*b* and 57*b*, respectively. Further, the controller 6 stops the supply of the Ti-containing gas from the Ti-containing gas supply source 56*a*. Further, the controller 6 supplies an Al-containing gas, a $N_2$ gas, and an $NH_3$ gas from the Al-containing gas supply source 51*a*, the $N_2$ gas supply sources 52*a* and 54*a*, and the $NH_3$ gas supply source 55*a* to the gas supply lines 51*b*, 52*b*, 54*b*, and 55*b*, respectively. At this time, since the valves 51*e*, 52*e*, 54*e*, and 55*e* are closed, the Al-containing gas, the $N_2$ gas, and the $NH_3$ gas are stored in the storage tanks 51*d*, 52*d*, 54*d*, and 55*d*, respectively, and the internal pressures of the storage tanks 51*d*, 55*d*, 54*d*, and 56*d* are increased.

The controller 6 opens the valve 51*e* to supply the Al-containing gas stored in the storage tank 51*d* into the processing container 1 and adsorb a film by the Al-containing gas on the surface of the wafer W (step S15). For example, when an $AlCl_3$ gas is used as the Al-containing gas, AlN is adsorbed on the surface of the wafer W by reaction of $AlCl_3+NH_3 \rightarrow AlN+HCl\uparrow$. Further, for example, when a TMA gas is used as the Al-containing gas, AlN is adsorbed on the surface of the wafer W by reaction of $C_6H_{18}Al_2+NH \rightarrow AlN+C_xH_y\uparrow$.

With the lapse of a predetermined time (for example, 0.05 to 5 seconds) from the open of the valve 51*e*, the controller 6 closes the valve 51*e* to stop the supply of the Al-containing gas into the processing container 1. Further, the controller 6 opens the valves 52*e* and 54*e* to supply the $N_2$ gas stored in the storage tanks 52*d* and 54*d* into the processing container 1, as a purge gas (step S16). At this time, since the $N_2$ gas is supplied from the storage tanks 52*d* and 54*d* in a state where the pressure is increased, the purge gas is supplied into the processing container 1 at a relatively large flow rate, for example, a flow rate larger than the flow rate of the carrier gas. Therefore, the Al-containing gas remaining in the processing container 1 is quickly discharged to the exhaust pipe 41, so that the interior of the processing container 1 is replaced with the $N_2$ gas atmosphere from the Al-containing gas atmosphere in a short time. Further, since the valve 51*e* is closed, the Al-containing gas supplied from the Al-containing gas supply source 51*a* to the gas supply line 51*b* is stored in the storage tank 51*d*, and the internal pressure of the storage tank 51*d* is increased. Further, since the valve 51*e* is closed, the carrier gas ($N_2$) supplied from the gas supply line 53*b* and the gas supply line 57*b* also functions as a purge gas to be able to discharge the excess Al-containing gas.

With the lapse of a predetermined time (for example, 0.05 to 5 seconds) from the open of the valves 52*e* and 54*e*, the controller 6 closes the valves 52*e* and 54*e* to stop the supply of the purge gas into the processing container 1. Further, the controller 6 opens the valve 55e to supply the $NH_3$ gas stored in the storage tank 55d into the processing container 1 to reduce the Al-containing gas adsorbed on the surface of the wafer W (step S17).

With the lapse of a predetermined time (for example, 0.05 to 5 seconds) from the open of the valve 55e, the controller 6 closes the valve 55e to stop the supply of the $NH_3$ gas into the processing container 1. Further, the controller 6 opens the valves 52e and 54e to supply the $N_2$ gas stored in the storage tanks 52d and 54e into the processing container 1, as a purge gas (step S18). At this time, since the $N_2$ gas is supplied from the storage tanks 52d and 54d in a state where the pressure is increased, the purge gas is supplied into the processing container 1 at a relatively large flow rate, for example, a flow rate larger than the flow rate of the carrier gas. Therefore, the $NH_3$ gas remaining in the processing container 1 is quickly discharged to the exhaust pipe 41, so that the interior of the processing container 1 is replaced with the $N_2$ gas atmosphere from the $NH_3$ gas atmosphere in a short time. Further, since the valve 55e is closed, the $NH_3$ gas supplied from the $NH_3$ gas supply source 55a to the gas supply line 55b is stored in the storage tank 55d, and the internal pressure of the storage tank 55d is increased. Further, since the valve 55e is closed, the carrier gas ($N_2$) supplied from the gas supply line 53b and the gas supply line 57b also functions as a purge gas to be able to discharge the excess $NH_3$ gas.

A B cycle of steps S15 to S18 corresponds to the step of forming the second base film.

The controller 6 forms an AlTiN film having a desired film thickness as a base film by repeating a cycle of steps S11 to S18a plurality of times.

Note that the gas supply sequence and process gas conditions for forming the base film shown in FIG. 7 are examples and are not limited thereto. Other gas supply sequence and process gas conditions may be used to form the base film.

Here, in the gas supply sequence shown in FIG. 7, the Ti-containing film is formed by the A cycle of steps S11 to S14, and the Al-containing film is formed by the B cycle of steps S15 to S18. Therefore, when the base film is formed, the Ti and Al content rates of the base film can be controlled by changing the number of times of performance of the A cycle and the B cycle.

It is preferable that the base film has the high Ti content rate in the lower portion on the AlO layer from the viewpoint of adhesion and reaction suppression. Further, it is preferable that the base film has the high Al content rate in the upper portion on the AlO layer from the viewpoint of easy formation and orientation of a metal layer. Therefore, it is preferable that the AlTiN film has the high Ti content rate in the lower portion and the high Al content rate in the upper portion.

Therefore, when forming the base film, the controller 6 controls the number of executions of the step of forming the first base film and the step of forming the second base film to adjust the film formation ratio of the first base film and the second base film. This makes it possible to make a gradation of element concentration for the base film. Further, for example, when forming the lower portion of the base film, the controller 6 performs the step of forming the first base film more than the step of forming the second base film. Further, when forming the upper portion of the base film, the controller 6 performs the step of forming the second base film more than the step of forming the first base film. For example, the controller 6 sets the cycle of steps S11 to S18 as one set and repeats the set Z times to form the AlTiN film.

In the lower portion film formation of the AlTiN film, the controller 6 performs the number of A cycles per set more than the number of B cycles per set. Further, in the upper portion film formation of the AlTiN film, the controller 6 performs the number of B cycles per set more than the number of A cycles per set. Further, for example, the controller 6 controls to perform the A cycle more times in the initial set of film formation of the base film and perform the B cycle more times in the final set of film formation of the base film. As an example, in the lower portion film formation of the base film, the controller 6 performs the A cycle twice and then the B cycle once. In the center film formation of the base film, the controller 6 performs the A cycle once and then the B cycle once. In the upper portion film formation of the base film, the controller 6 performs the A cycle once and then the B cycle twice. The number of times of performance of the A cycle and the B cycle is an example, and is not limited thereto. From the viewpoint of adhesion to the AlO layer, it is preferable that the base film is first subjected to the A cycle. Further, from the viewpoint of easy formation and orientation of a metal layer, it is preferable that the base film is subjected to the B cycle at the end.

The controller 6 adjusts the film formation ratio of the first base film and the second base film so that the composition ratio of Ti and Al of the base film is 20 to 95%: 5 to 80%.

[Formation of Metal Layer]

Figure 8:
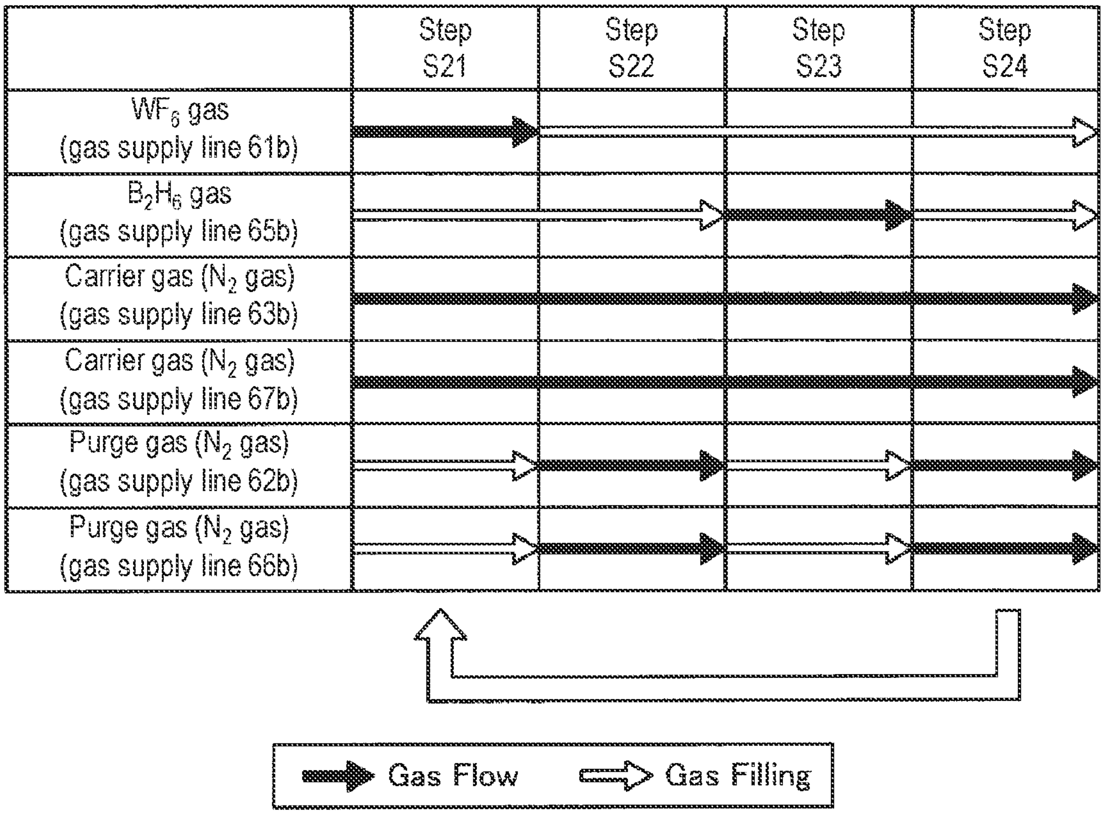
FIG. 8 is a view illustrating an example of a gas supply sequence when an initial tungsten film is formed as a metal layer according to the first embodiment.

Next, the flow of forming a metal layer will be described. In the present embodiment, the film forming apparatus 102 forms an initial tungsten film as a metal layer, and the film forming apparatus 103 forms a main tungsten film as a metal layer. FIG. 8 is a view illustrating an example of a gas supply sequence when the initial tungsten film is formed as a metal layer according to the first embodiment.

The controller 6 of the film forming apparatus 102 controls the heater 21 of the stage 2 to heat the wafer W to a predetermined temperature (for example, 250 to 550 degrees C.). Further, the controller 6 controls the pressure control valve of the exhaust mechanism 42 to adjust the interior of the processing container 1 to a predetermined pressure (for example, 0.1 to 10 Torr).

The controller 6 opens the valves 63e and 67e to supply a predetermined flow rate of carrier gas ($N_2$ gas) from the $N_2$ gas supply sources 63a and 67a to the gas supply lines 63b and 67b, respectively. Further, the controller 6 supplies a $WF_6$ gas and a $B_2H_6$ gas to the gas supply lines 61b and 65b, respectively, from the $WF_6$ gas supply source 61a and the $B_2H_6$ gas supply source 65a, respectively. At this time, since the valves 61e and 65e are closed, the $WF_6$ gas and the $B_2H_6$ gas are stored in the storage tanks 61d and 65d, respectively, and the internal pressures of the storage tanks 61d and 65d are increased.

Next, the controller 6 opens the valve 61e to supply the $WF_6$ gas stored in the storage tank 61d into the processing container 1 and adsorb the $WF_6$ gas on the surface of the wafer W (step S21). Further, the controller 6 supplies a purge gas ($N_2$ gas) from the $N_2$ gas supply sources 62a and 66a to the gas supply lines 62b and 66b, respectively, in parallel with the supply of the $WF_6$ gas into the processing container 1. At this time, since the valves 62e and 66e are closed, the purge gas is stored in the storage tanks 62d and 66d, and the internal pressures of the storage tanks 62d and 66d are increased.

With the lapse of a predetermined time (for example, 0.05 to 5 seconds) from the open of the valve 61e, the controller 6 closes the valve 61e to stop the supply of the $WF_6$ gas into the processing container 1. Further, the controller 6 opens the valves 62e and 66e to supply the purge gas stored in the storage tanks 62*d* and 66*d* into the processing container 1 (step S22). At this time, since the purge gas is supplied from the storage tanks 62*d* and 66*d* in a state where the pressure is increased, the purge gas is supplied into the processing container 1 at a relatively large flow rate, for example, a flow rate larger than the flow rate of the carrier gas. Therefore, the $WF_6$ gas remaining in the processing container 1 is quickly discharged to the exhaust pipe 41, and the interior of the processing container 1 is replaced with the $N_2$ gas-containing atmosphere from the $WF_6$ gas atmosphere in a short time. On the other hand, since the valve 61*e* is closed, the $WF_6$ gas supplied from the $WF_6$ gas supply source 61*a* to the gas supply line 61*b* is stored in the storage tank 61*d*, and the internal pressure of the storage tank 61*d* is increased.

With the lapse of a predetermined time (for example, 0.05 to 5 seconds) from the open of the valves 62*e* and 66*e*, the controller 6 closes the valves 62*e* and 66*e* to stop the supply of the purge gas into the processing container 1. Further, the controller 6 opens the valve 65*e* to supply the $B_2H_6$ gas stored in the storage tank 65*d* into the processing container 1 to reduce the $WF_6$ gas adsorbed on the surface of the wafer W (step S23). At this time, since the valves 62*e* and 66*e* are closed, the purge gas supplied from the $N_2$ gas supply sources 62*a* and 66*a* to the gas supply lines 62*b* and 66*b* is stored in the storage tanks 62*d* and 66*d*, and the internal pressures of the storage tanks 62*d* and 66*d* are increased.

With the lapse of a predetermined time (for example, 0.05 to 5 seconds) from the open of the valve 65*e*, the controller 6 closes the valve 65*e* to stop the supply of the $B_2H_6$ gas into the processing container 1. Further, the controller 6 opens the valves 62*e* and 66*e* to supply the purge gas stored in the storage tanks 62*d* and 66*d* into the processing container 1 (step S24). At this time, since the purge gas is supplied from the storage tanks 62*d* and 66*d* in a state where the pressure is increased, the purge gas is supplied into the processing container 1 at a relatively large flow rate, for example, a flow rate larger than the flow rate of the carrier gas. Therefore, the $B_2H_6$ gas remaining in the processing container 1 is quickly discharged to the exhaust pipe 41, so that the interior of the processing container 1 is replaced with the $N_2$ gas-containing atmosphere from the $B_2H_6$ gas atmosphere in a short time. On the other hand, since the valve 65*e* is closed, the $B_2H_6$ gas supplied from the $B_2H_6$ gas supply source 65*a* to the gas supply line 65*b* is stored in the storage tank 65*d*, and the internal pressure of the storage tank 65*d* is increased.

The controller 6 forms the initial tungsten film having a desired film thickness by repeating a cycle of steps S21 to S24 a plurality of times (for example, 1 to 50 cycles).

Note that the gas supply sequence and process gas conditions for forming the initial tungsten film shown in FIG. 8 are examples and are not limited thereto. Other gas supply sequence and process gas conditions may be used to form the initial tungsten film.

Figure 9:
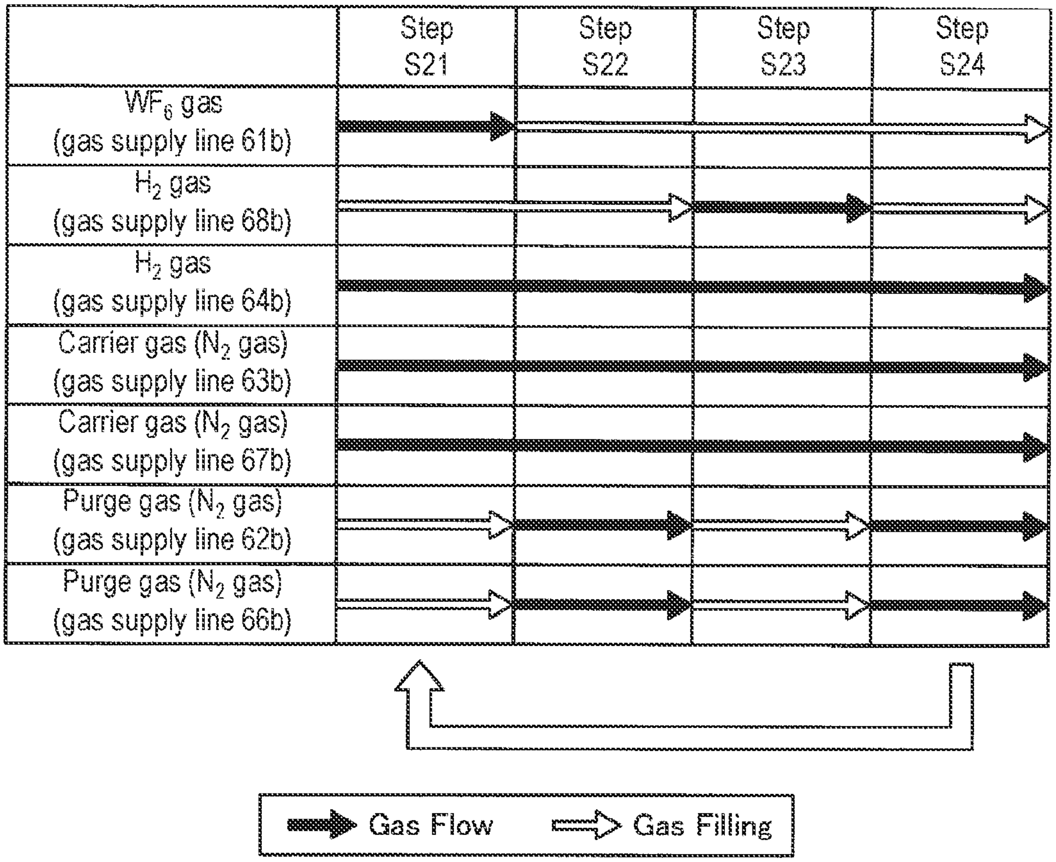
FIG. 9 is a view illustrating an example of a gas supply sequence when a main tungsten film is formed as a metal layer according to the first embodiment.

FIG. 9 is a view illustrating an example of a gas supply sequence when a main tungsten film is formed as a metal layer according to the first embodiment. The controller 6 of the film forming apparatus 103 controls the heater 21 of the stage 2 to heat the wafer W to a predetermined temperature (for example, 250 to 550 degrees C.). Further, the controller 6 controls the pressure control valve of the exhaust mechanism 42 to adjust the interior of the processing container 1 to a predetermined pressure (for example, 0.1 to 10 Torr).

The controller 6 opens the valves 63*e* and 67*e* to supply a predetermined flow rate of carrier gas ($N_2$ gas) from the $N_2$ gas supply sources 63*a* and 67*a* to the gas supply lines 63*b* and 67*b*, respectively. Further, the controller 6 opens the valve 64*e* to supply a predetermined flow rate of $H_2$ gas from the $H_2$ gas supply source 64*a* to the gas supply line 64*b*. Further, the controller 6 supplies a $WF_6$ gas and a $H_2$ gas from the $WF_6$ gas supply source 61*a* and the $H_2$ gas supply source 68*a* to the gas supply lines 61*b* and 68*b*, respectively. At this time, since the valves 61*e* and 68*e* are closed, the $WF_6$ gas and the $H_2$ gas are stored in the storage tanks 61*d* and 68*d*, respectively, and the internal pressures of the storage tanks 61*d* and 68*d* are increased.

Next, the controller 6 opens the valve 61*e* to supply the $WF_6$ gas stored in the storage tank 61*d* into the processing container 1 and adsorb the $WF_6$ gas on the surface of the wafer W (step S21). Further, the controller 6 supplies a purge gas ($N_2$ gas) from the $N_2$ gas supply sources 62*a* and 66*a* to the gas supply lines 62*b* and 66*b*, respectively, in parallel with the supply of the $WF_6$ gas into the processing container 1. At this time, since the valves 62*e* and 66*e* are closed, the purge gas is stored in the storage tanks 62*d* and 66*d*, and the internal pressures of the storage tanks 62*d* and 66*d* are increased.

With the lapse of a predetermined time (for example, 0.05 to 5 seconds) from the open of the valve 61*e*, the controller 6 closes the valve 61*e* to stop the supply of the $WF_6$ gas into the processing container 1. Further, the controller 6 opens the valves 62*e* and 66*e* to supply the purge gas stored in the storage tanks 62*d* and 66*d* into the processing container 1 (step S22). At this time, since the purge gas is supplied from the storage tanks 62*d* and 66*d* in a state where the pressure is increased, the purge gas is supplied into the processing container 1 at a relatively large flow rate, for example, a flow rate larger than the flow rate of the carrier gas. Therefore, the $WF_6$ gas remaining in the processing container 1 is quickly discharged to the exhaust pipe 41, and the interior of the processing container 1 is replaced with the atmosphere containing the $H_2$ gas and the $N_2$ gas from the $WF_6$ gas atmosphere in a short time. On the other hand, since the valve 61*e* is closed, the $WF_6$ gas supplied from the $WF_6$ gas supply source 61*a* to the gas supply line 61*b* is stored in the storage tank 61*d*, and the internal pressure of the storage tank 61*d* is increased.

With the lapse of a predetermined time (for example, 0.05 to 5 seconds) from the open of the valves 62*e* and 66*e*, the controller 6 closes the valves 62*e* and 66*e* to stop the supply of the purge gas into the processing container 1. Further, the controller 6 opens the valve 68*e* to supply the $H_2$ gas stored in the storage tank 68*d* into the processing container 1 to reduce the $WF_6$ gas adsorbed on the surface of the wafer W (step S23). At this time, since the valves 62*e* and 66*e* are closed, the purge gas supplied from the $N_2$ gas supply sources 62*a* and 66*a* to the gas supply lines 62*b* and 66*b* is stored in the storage tanks 62*d* and 66*d*, and the internal pressures of the storage tanks 62*d* and 66*d* are increased.

With the lapse of a predetermined time (for example, 0.05 to 5 seconds) from the open of the valve 68*e*, the controller 6 closes the valve 68*e* to stop the supply of the $H_2$ gas into the processing container 1. Further, the controller 6 opens the valves 62*e* and 66*e* to supply the purge gas stored in the storage tanks 62*d* and 66*d* into the processing container 1 (step S24). At this time, since the purge gas is supplied from the storage tanks 62*d* and 66*d* in a state where the pressure is increased, the purge gas is supplied into the processing container 1 at a relatively large flow rate, for example, a flow rate larger than the flow rate of the carrier gas. Therefore, the $H_2$ gas remaining in the processing container 1 is quickly discharged to the exhaust pipe 41, so that the interior of the processing container 1 is replaced with the atmosphere containing $H_2$ gas and $N_2$ gas from the $H_2$ gas atmosphere in a short time. On the other hand, since the valve 68*e* is closed, the $H_2$ gas supplied from the $H_2$ gas supply source 68*a* to the gas supply line 68*b* is stored in the storage tank 68*d*, and the internal pressure of the storage tank 68*d* is increased.

The controller 6 forms a tungsten film having a desired film thickness by repeating a cycle of steps S21 to S24 a plurality of times (for example, 50 to 3,000 cycles).

Note that the gas supply sequence and process gas conditions for forming the main tungsten film shown in FIG. 9 are examples and are not limited thereto. Other gas supply sequence and process gas conditions may be used to form the tungsten film.

[Operation and Effects]

Figure 10:
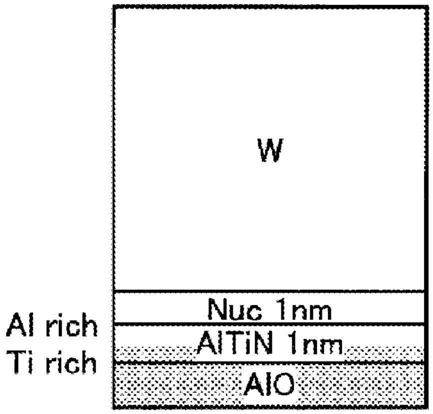
FIG. 10 is a view illustrating an example of a wafer layer configuration according to the first embodiment.

Next, the operation and effects of the film forming method according to the present embodiment will be described. FIG. 10 is a view illustrating an example of a wafer layer configuration according to the first embodiment. FIG. 10 illustrates an example of the layer configuration of the wafer W on which a film is formed by the film forming method according to the first embodiment. In the wafer W, an AlO layer is formed for blocking on a silicon ($SiO_2$) layer (not shown). Further, in the wafer W, an AlTiN film having a thickness of, for example, 1 nm is formed as a base film on the AlO layer by the film forming method according to the present embodiment from the viewpoint of adhesion and reaction suppression. The AlTiN film is formed with the high Ti content rate in the lower portion and the high Al content rate in the upper portion. Further, in the wafer W, a tungsten nucleation film (Nuc) having a thickness of, for example, 1 nm is formed as an initial tungsten film on the AlTiN film. Further, in the wafer W, a low resistance tungsten film (W) is formed on the nucleation film.

Here, an example of the process conditions of the film forming method according to the embodiment is collectively described below.

AlTiN Film
Temperature: 250 to 550 degrees C.
Pressure: 0.1 to 10 Torr
Ti-containing gas: 10 to 500 sccm
Al-containing gas: 10 to 500 sccm
Carrier gas ($N_2$): 3,000 to 30,000 sccm
Purge gas ($N_2$): 0 to 20,000 sccm
$NH_3$ gas: 1,000 to 20,000 sccm Time:
Ti-containing gas: 0.05 to 5 seconds
Al-containing gas: 0.05 to 5 seconds
Purge: 0.05 to 5 seconds
$NH_3$ gas: 0.05 to 5 seconds
Purge: 0.05 to 5 seconds Nucleation Film:
Temperature: 250 to 550 degrees C.
Pressure: 0.1 to 10 Torr
W-containing gas: 10 to 500 sccm
Carrier gas ($N_2$): 3,000 to 30,000 sccm
Purge gas ($N_2$): 1,000 to 10,000 sccm
$H_2$ gas: 1,000 to 10,000 sccm
$SiH_4$ gas, $B_2H_6$ gas: 10 to 1,000 sccm Time:
W-containing gas: 0.05 to 5 seconds
Purge: 0.05 to 5 seconds
$SiH_4$ gas, $B_2H_6$ gas: 0.05 to 5 seconds
Purge: 0.05 to 5 seconds W Film:
Temperature: 250 to 550 degrees C.
Pressure: 0.1 to 10 Torr
W-containing gas: 100 to 500 sccm
Carrier gas ($N_2$): 3,000 to 30,000 sccm
Purge gas ($N_2$): 1,000 to 10,000 sccm
$H_2$ gas: 1,000 to 10,000 sccm Time:
W-containing gas: 0.05 to 15 seconds
Purge: 0.05 to 15 seconds
$H_2$ gas: 0.05 to 15 seconds
Purge: 0.05 to 15 seconds The wafer W can obtain adhesion by forming the AlTiN film having the high Ti content rate in the lower portion on the AlO layer, thereby suppressing the reaction of the AlO layer. The thickness of the AlTiN film is preferably 3.5 nm or less, and if the thickness is about 1 nm, the adhesion to the AlO layer can be obtained, thereby suppressing the reaction of the AlO layer. Further, by increasing the Ti content rate in the lower portion of the AlTiN film, the adhesion to the AlO layer can be further enhanced. Further, by increasing the Al content rate in the upper portion of the AlTiN film, the orientation of TiN can be canceled. As a result, in the wafer W, the grains of tungsten to be formed can be grown larger, thereby reducing the resistance of the tungsten film.

Further, in the wafer W, the adhesion of the tungsten to be formed can be improved by forming the nucleation film. Further, in the wafer W, the uniformity of the tungsten to be formed can be improved by forming the nucleation film. The nucleation film preferably has a thickness of about 0.5 to 5 nm.

Figure 11:
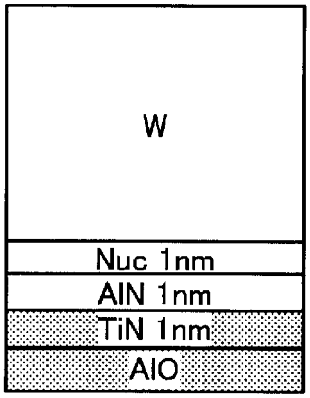
FIG. 11 (BACKGROUND ART)
FIG. 11 is a view illustrating an example of a wafer layer configuration according to a comparative example.

Here, the effects will be explained using a comparative example. FIG. 11 is a view illustrating an example of a wafer layer configuration according to the comparative example. FIG. 11 illustrates an example of a conventional layer configuration of the wafer W. In the wafer W, an AlO layer is formed for blocking on a silicon ($SiO_2$) layer (not shown), and a TiN film having a thickness of, for example, 1 nm is formed on the AlO layer from the viewpoint of adhesion and reaction suppression. Further, in the wafer W, an AlN film having a thickness of, for example, 1 nm is formed on the TiN film. Further, in the wafer W, a tungsten nucleation film (Nuc) having a thickness of, for example, 1 nm is formed on the AlN film. Further, in the wafer W, a low resistance tungsten film (W) is formed on the nucleation film.

An example of the process conditions for forming each film of the comparative example is described below.

Figure 12:
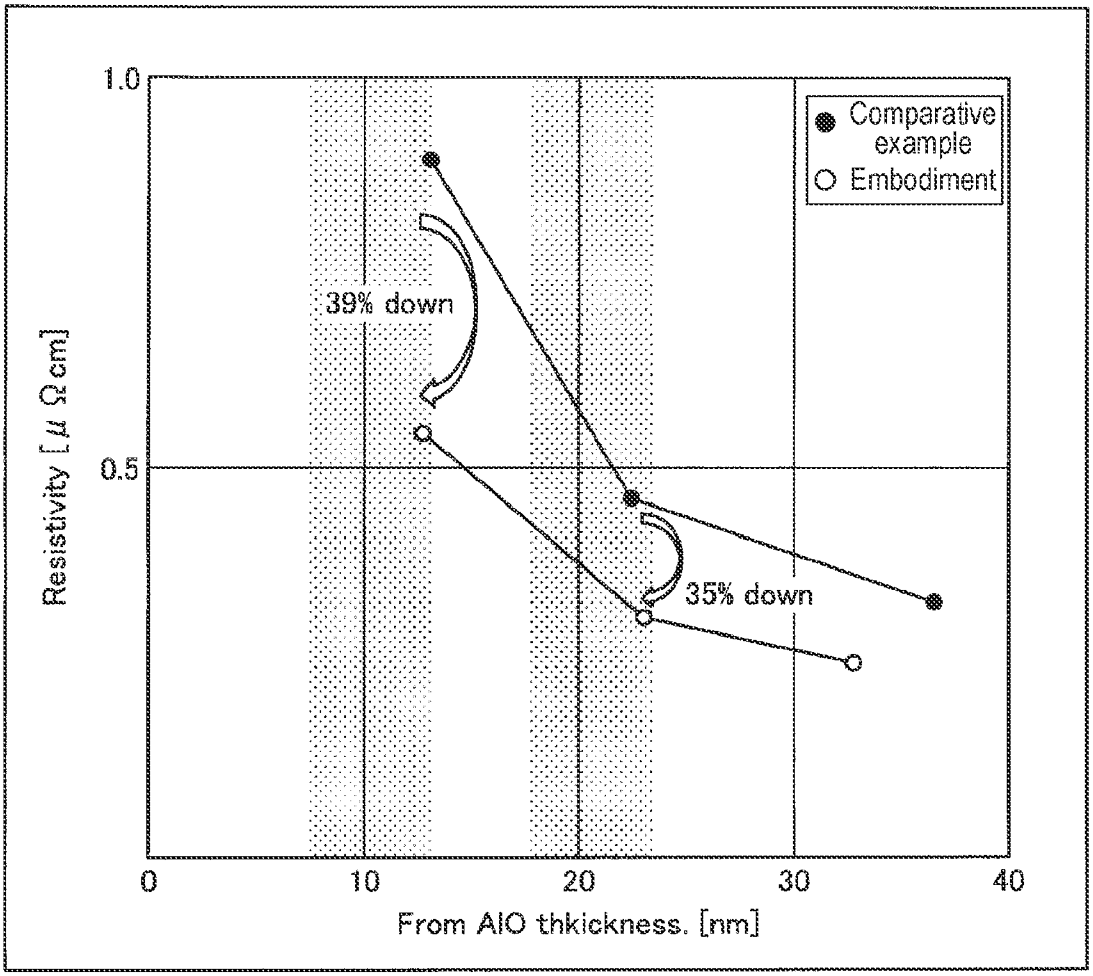
FIG. 12 is a view illustrating an example of a change in resistivity with respect to the thickness of a tungsten film.

Nucleation Film:
Temperature: 250 to 550 degrees C.
Pressure: 0.1 to 10 Torr
W-containing gas: 10 to 500 sccm
Carrier gas ($N_2$): 3,000 to 30,000 sccm
Purge gas ($N_2$): 1,000 to 10,000 sccm
$H_2$ gas: 1,000 to 20,000 sccm
$SiH_4$ gas, $B_2H_6$ gas: 10 to 1,000 sccm Time:
W-containing gas: 0.05 to 5 seconds
Purge: 0.05 to 5 seconds
$SiH_4$ gas, $B_2H_6$ gas: 0.05 to 5 seconds
Purge: 0.05 to 5 seconds W Film:
Temperature: 250 to 550 degrees C.
Pressure: 0.1 to 20 Torr
W-containing gas: 100 to 500 sccm
Carrier gas ($N_2$): 1,000 to 10,000 sccm
Purge gas ($N_2$): 0 to 10,000 sccm
$H_2$ gas: 500 to 20,000 sccm Time:
W-containing gas: 0.05 to 15 seconds
Purge: 0.05 to 15 seconds
$H_2$ gas: 0.05 to 15 seconds
Purge: 0.05 to 15 seconds FIG. 12 is a view illustrating an example of a change in resistivity with respect to the thickness of a tungsten film. FIG. 12 illustrates a change in resistivity due to the thickness of the tungsten film depending on the layer configuration of the present embodiment shown in FIG. 10 and the layer configuration of the comparative example shown in FIG. 11. In the example of FIG. 12, the thickness of the tungsten film is measured from an interface with the AlO layer. That is, in the layer configuration of the present embodiment, the thicknesses of the AlTiN film, the nucleation film (Nuc), and the tungsten film (W) are defined as the thickness of the tungsten film. In the layer configuration of the comparative example, the thicknesses of the TiN film, the AlN film, the Nucleation film (Nuc), and the tungsten film (W) are defined as the thickness of the tungsten film. Further, in the example of FIG. 12, the resistivity is shown by normalizing with reference to the resistivity of the comparative example when the thickness is 10 nm. As illustrated in FIG. 12, when the thickness is 12 nm, the resistivity of the layer configuration of the present embodiment is reduced by 39% as compared with the layer configuration of the comparative example. Further, when the thickness is 22 nm, the resistivity of the layer configuration of the present embodiment is reduced by 35% as compared with the layer configuration of the comparative example.

Here, as described above, the wring of LSI is miniaturized and thus it is required to reduce the resistance of the wiring. For example, in a three-dimensional laminated semiconductor memory such as a 3D NAND flash memory, a tungsten film is formed as a word line, but further reduction in the resistance of the tungsten film is required for miniaturization.

In contrast, the layer configuration of the present embodiment can reduce the resistance of the tungsten film even when it is thinned.

Further, in the layer configuration of the comparative example shown in FIG. 11, since the TiN film and the AlN film are formed by different film forming apparatuses, the transfer time of the wafer W between the film forming apparatuses is required. On the other hand, in the layer configuration of the present embodiment shown in FIG. 10, since the AlTiN film can be formed by one film forming apparatus 101, the transfer time of the wafer W between the film forming apparatuses can be reduced, thereby improving the productivity.

Further, in the layer configuration of the comparative example shown in FIG. 11, when the TiN film and the AlN film are formed by different film forming apparatuses and transferred between the film forming apparatuses in the air, surface oxidation occurs. On the other hand, in the layer configuration of the present embodiment shown in FIG. 10, since the AlTiN film can be formed by one film forming apparatus 101, the occurrence of surface oxidation can be prevented.

Figure 13A:
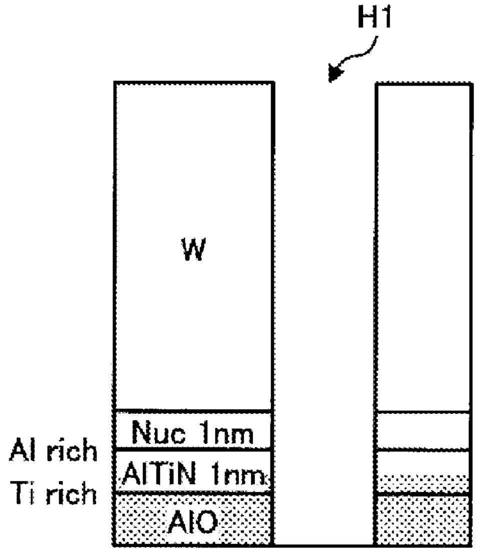
FIG. 13A is a view illustrating an example of a wafer W in which a recess is formed.
Figure 13B:
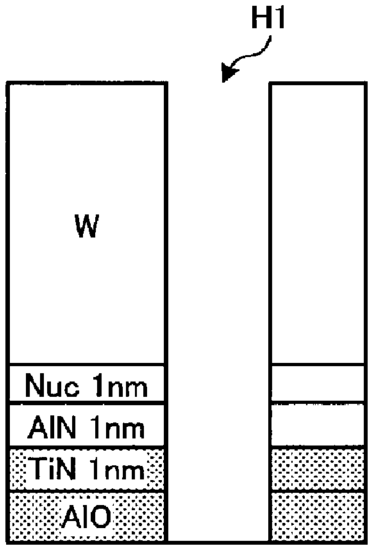
FIG. 13B (BACKGROUND ART)
FIG. 13B is a view illustrating an example of a wafer W in which a recess is formed.

Further, the wafer W on which the metal layer is formed is further subjected to various substrate processing such as etching. FIGS. 13A and 13B are views illustrating an example of a wafer W in which a recess is formed. In FIG. 13A, the wafer W having the layer configuration of the present embodiment shown in FIG. 10 is etched to form a recess H1. In FIG. 13B, the wafer W having the layer configuration of the comparative example shown in FIG. 11 is etched to form a recess H1. In FIG. 13B, the cross section of the AlN film is exposed at the recess H1.

As illustrated in FIG. 13B, when the cross section of the AlN film is exposed at the recess H1 and wet etching is performed on the wafer W, the AlN film is etched from the cross section, which may make the shape of the recess H defective. On the other hand, for example, even when wet etching is performed on the wafer W of FIG. 13A, since the etching rate of the AlTiN film is low, the occurrence of shape defect in the recess H1 can be suppressed.

Further, in the method of the comparative example, since the reaction of $AlN+ClF_3 \rightarrow AlF$ occurs and AlF becomes a particle source because of its low volatility, it is difficult to perform dry cleaning in a chamber by, for example, $ClF_3$ or the like. On the other hand, in the method of the present embodiment, when dry cleaning is performed with, for example, $ClF_3$ or the like, the reaction of $AlTiN+ClF_3 \rightarrow AlTiF$ occurs and AlTiF may be removed by the dry cleaning. Therefore, it is possible to perform the dry cleaning of the chamber.

Figure 14:
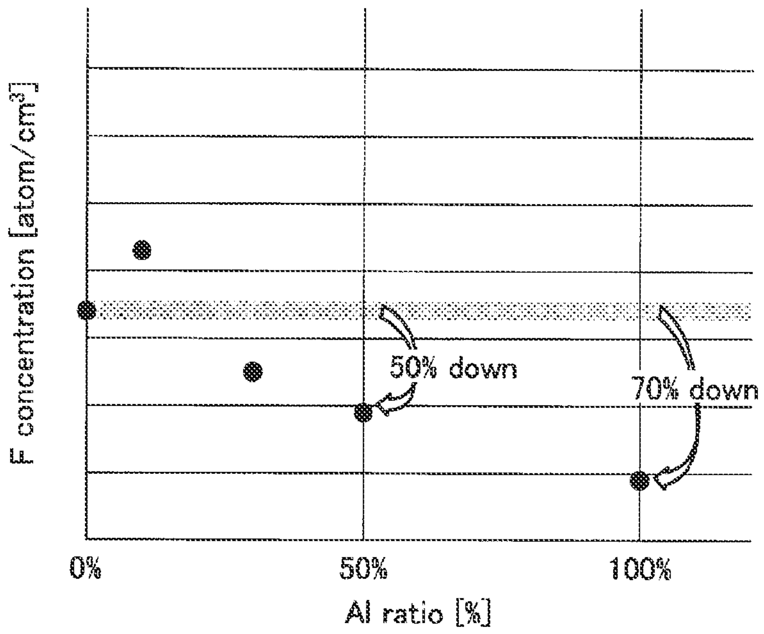
FIG. 14 is a view illustrating an example of the concentration of F with respect to the Al content ratio of a base film.

Further, in the film forming method according to the present embodiment, the Ti and Al content rates of the AlTiN film formed as the base film can be controlled. The higher the Al ratio of the base film, the better the barrier property of fluorine (F). FIG. 14 is a view illustrating an example of the concentration of F with respect to the Al content rate of a base film. FIG. 14 shows the result of measurement of the F concentration of the base film obtained by forming each layer configuration of the present embodiment shown in FIG. 10 on the wafer W with the Al content rate of the base film set to 0%, 5%, 30%, 50%, and 100%. The Al content rate of the base film is obtained from the entire base film by regarding the base film as a bulk. The base film is a TiN film when the Al content rate is 0%, an AlTiN film when the Al content rate is 5%, 30%, and 50%, and an AlN film when the Al content rate is 100%. The F concentration is measured by the measurement method of Backside SIMS, which analyzes the vicinity of a sample surface by the approach from the back surface side of the sample. In FIG. 14, the F concentration is shown by normalizing with reference to the F concentration having the Al content rate of 0%. As illustrated in FIG. 14, the base film tends to have a lower F concentration as the Al content rate is higher. For example, in the base film, when the Al content rate is 50%, the F concentration is lower by about 50% than when the Al content rate is 0%. Further, in the base film, when the Al content rate is 100%, the F concentration is lower by about 70% than when the Al content rate is 0%. Therefore, in the film forming method according to the present embodiment, the barrier property of F of the base film is improved by forming the base film such that the Al content rate is 30% or more.

Figure 15:
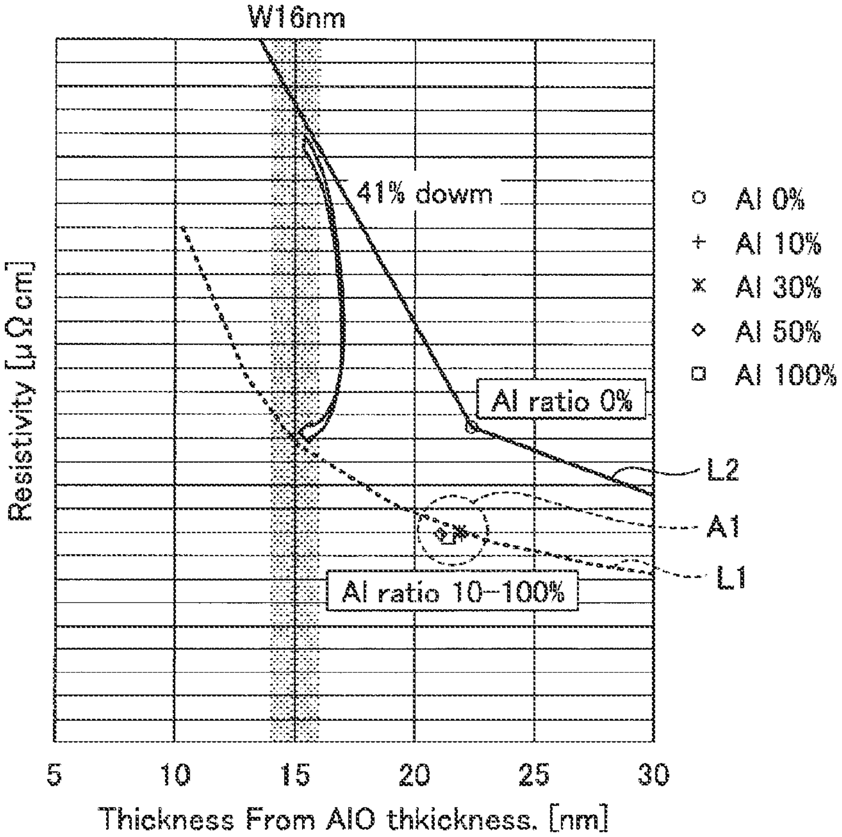
FIG. 15 is a view illustrating an example of a change in resistivity with respect to the thickness of a tungsten film.

Further, in the layer configuration of the present embodiment as illustrated in FIG. 10, the resistivity of the tungsten film (W) changes depending on the Al ratio of the base film. FIG. 15 is a view illustrating an example of a change in resistivity with respect to the thickness of the tungsten film. FIG. 15 shows the resistivity with respect to the thickness of the tungsten film when the Al content rate of the base film is 0%, 10%, 30%, 50%, and 100%. The thickness of the tungsten film is measured from an interface with the AlO layer. FIG. 15 shows the resistivity of the tungsten film when the Al content rate of the base film is 0%, 10%, 30%, 50%, and 100%. The resistivity when the Al content rate of the base film is 10%, 30%, 50%, and 100% is plotted to the same extent as indicated in a range Al. When the Al content rate of the base film is 10 to 100%, the resistivity of the tungsten film changes in the same manner regardless of the Al content rate. On the other hand, the resistivity when the Al content rate of the base film is 0% is plotted above the range Al. FIG. 15 shows a line L1 indicating the tendency of change in resistivity when the Al content rate of the base film is 10 to 100%, and a line L2 indicating the tendency of change in resistivity when the Al content rate of the base film is 0%. When the Al ratio of the base film is 10% or more, the resistivity of the tungsten film decreases. For example, when the thickness of the tungsten film is 15 nm, the resistivity of the tungsten film when the Al content rate of the base film is 10 to 100% is lower by 41% than when the Al content rate of the base film is 0%. Therefore, in the film forming method according to the present embodiment, the tungsten film can be made resistant by forming the base film such that the Al content rate is 10% or more.

Figure 16:
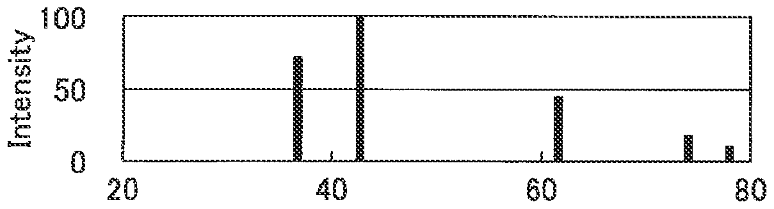
FIG. 16 is a view illustrating an example of a diffraction angle at which a peak occurs in intensity when a TiN film is X-ray-analyzed.
Figure 17A:
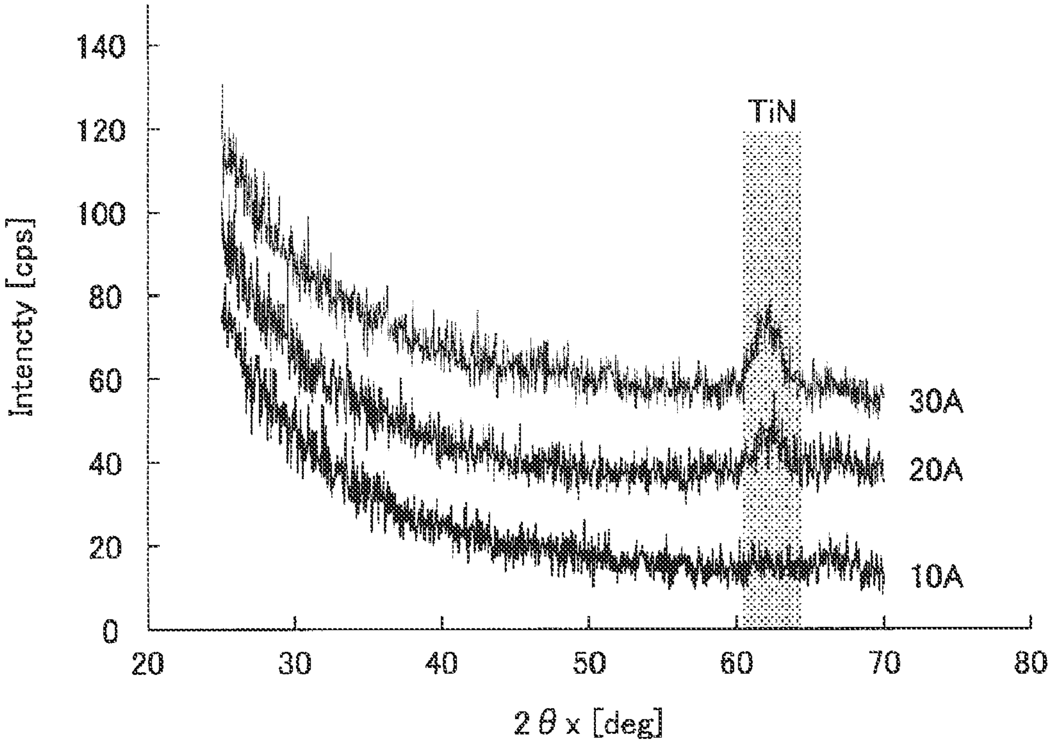
FIG. 17A is a view illustrating an example of a diffraction profile obtained by X-ray analysis of an AlTiN film.
Figure 17B:
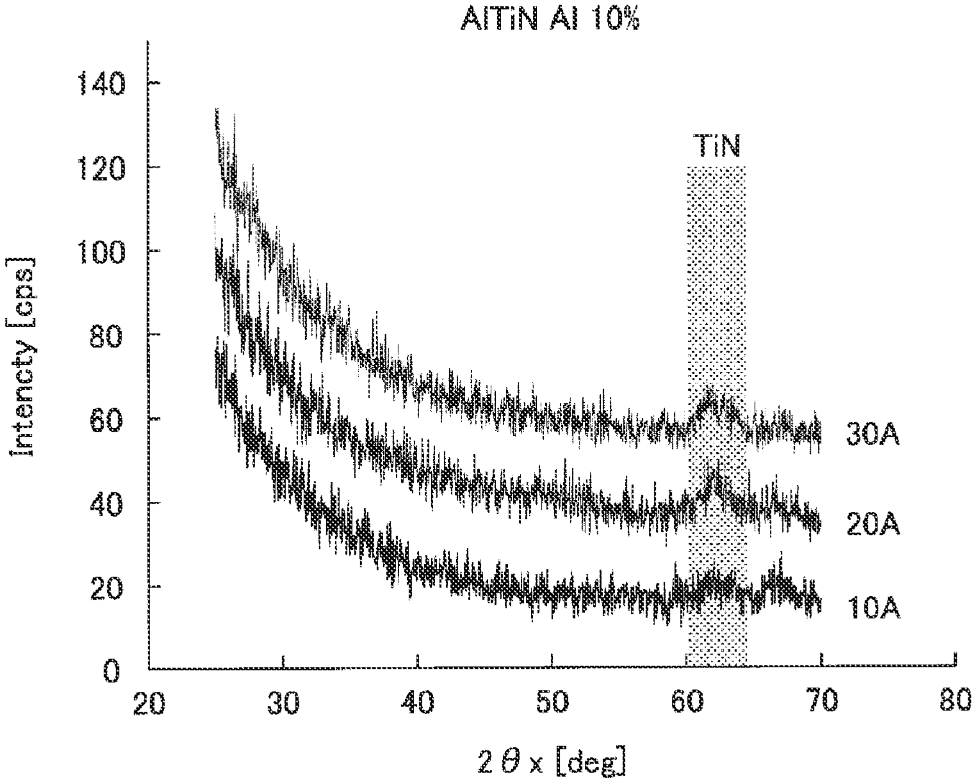
FIG. 17B is a view illustrating an example of a diffraction profile obtained by X-ray analysis of an AlTiN film.
Figure 17C:
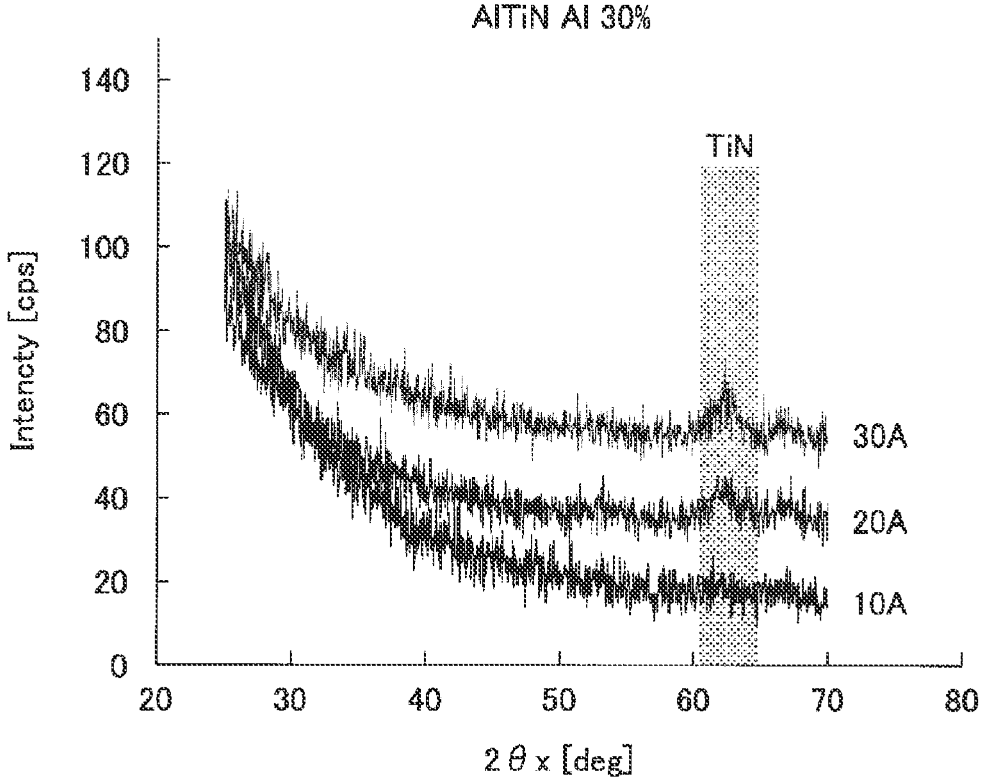
FIG. 17C is a view illustrating an example of a diffraction profile obtained by X-ray analysis of an AlTiN film.
Figure 17D:
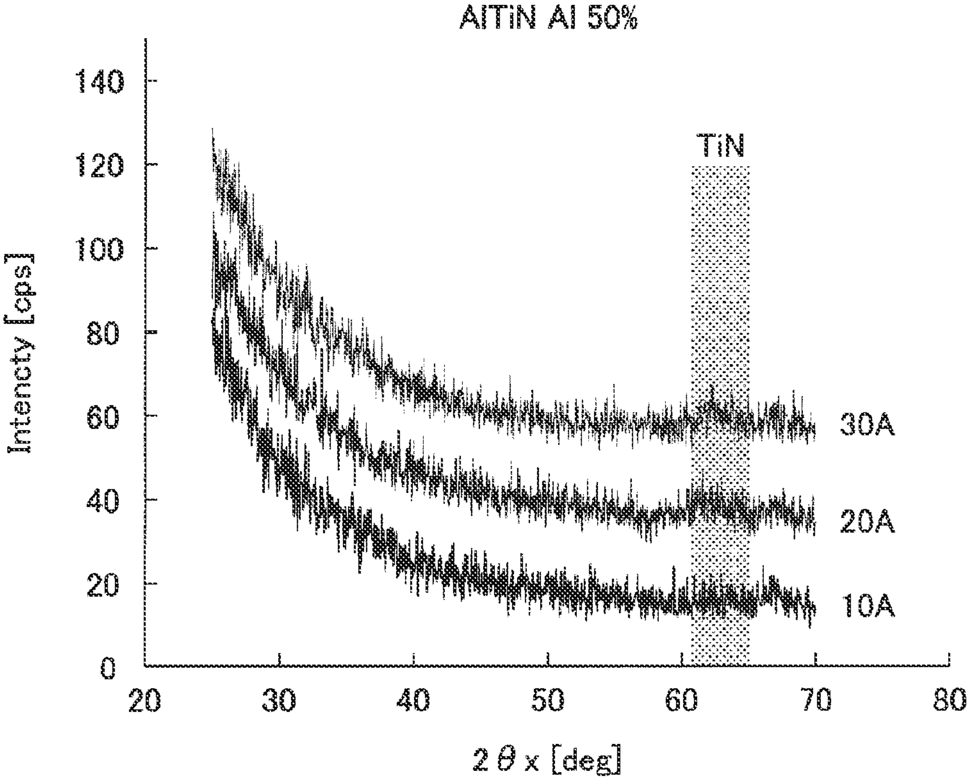
FIG. 17D is a view illustrating an example of a diffraction profile obtained by X-ray analysis of an AlTiN film.

Further, the crystallinity of the AlTiN film formed as the base film changes depending on the Al ratio due to the influence of TiN. Since the TiN film is a film having the crystallinity, a peak occurs in intensity at a specific diffraction angle when an X-ray analysis (X-ray diffraction: XRD) is performed. FIG. 16 is a view illustrating an example of a diffraction angle at which a peak occurs in intensity when the TiN film is X-ray-analyzed. In the TiN film, a peak occurs in intensity in the vicinity of, for example, a diffraction angle of 40° or a diffraction angle of 60°. Since the degree of influence of TiN changes depending on the Al ratio of the AlTiN film, the crystallinity can be controlled by the Al ratio. FIGS. 17A to 17D are views illustrating an example of a diffraction profile obtained by X-ray analysis of the AlTiN film. FIG. 17A shows substantially a diffraction profile of the TiN film with the Al content rate of 0%. FIG. 17B shows a diffraction profile of the AlTiN film with the Al content rate of 10%. FIG. 17C shows a diffraction profile of the AlTiN film with the Al content rate of 30%. FIG. 17D shows a diffraction profile of the AlTiN film with the Al content rate of 50%. FIGS. 17A to 17D show waveforms of the diffraction profile when the film thickness of the AlTiN film is 10 Å, 20 Å, and 30 Å, respectively. In the waveforms of the diffraction profile, when the film has the crystallinity, the thicker the film thickness, the larger the peak appears in intensity. For example, as illustrated in FIGS. 17A to 17C, when the Al content rate of the AlTiN film is 0% to 30%, a peak occurs in intensity in the vicinity of the diffraction angle of 60° at which the peak occurs in intensity in the TiN film. Therefore, when the Al content rate of the AlTiN film is 0% to 30%, it can be determined that the AlTiN film is formed as a film having the crystallinity. On the other hand, as illustrated in FIG. 17D, when the Al content rate of the AlTiN film is 50%, no peak occurs even in the vicinity of the diffraction angle of 60°. Therefore, when the Al content rate of the AlTiN film is 50%, it can be determined that the AlTiN film has no crystallinity and is formed as an amorphous film. When the lower AlTiN film has the crystallinity, the nucleation film takes over the crystallinity in the lower portion and a certain amount of film thickness is required to cancel the crystallinity and grow tungsten, which is formed as a high resistance film. On the other hand, when the lower AlTiN film is amorphous, the nucleation film is formed as a low resistance film because the lower portion has no crystallinity and the nucleation film can be thinned. Therefore, in the film forming method according to the present embodiment, by forming the AlTiN film such that the Al content rate is 50% or more to make the AlTiN film amorphous, the nucleation film can be made low in resistance and therefore the tungsten film can be made lower in resistance.

As described above, the film forming method according to the present embodiment has the step in which the wafer W on which the insulating film (AlO layer) is formed is disposed in the processing container 1 and the Ti-containing gas, the Al-containing gas, and the reaction gas are repeatedly supplied into the processing container 1 under the decompressed atmosphere to form the base film and the step in which the metal layer made of a metal material is formed on the wafer W on which the base film is formed. As a result, the film forming method according to the present embodiment can reduce the resistance of the tungsten film even when the film is thinned.

Further, in the film forming method according to the present embodiment, the step of forming the base film includes repeating at least once the step of forming the first base film by repeating at least once the alternating supply of the Ti-containing gas and the reaction gas with the purge step interposed therebetween (the A cycle) and the step of forming the second base film by repeating at least once the alternating supply of the Al-containing gas and the reaction gas with the purge step interposed therebetween (the B cycle). As a result, the film forming method according to the present embodiment can make gradations of element concentrations of Ti and Al for the base film.

Further, in the film forming method according to the present embodiment, in the case of forming the lower portion of the base film, the step of forming the base film performs the step of forming the first base film more than the step of forming the second base film. In the case of forming the upper portion of the base film, the step of forming the base film performs the step of forming the second base film more than the step of forming the first base film. As a result, the film forming method according to the present embodiment can form a film having the high Ti content rate in the lower portion of the base film and the high Al content rate in the upper portion of the base film.

Further, in the film forming method according to the present embodiment, the step of forming the base film performs first the step of forming the first base film. As a result, the film forming method according to the present embodiment can improve the adhesion between the insulating film and the base film.

Further, in the film forming method according to the present embodiment, the step of forming the base film performs finally the step of forming the second base film. As a result, the film forming method according to the present embodiment can form a metal layer with good uniformity.

Second Embodiment

Next, a second embodiment will be described. A film forming system 100 and film forming apparatuses 101 to 104 according to the second embodiment are the same configurations of the film forming system 100 and the film forming apparatuses 101 to 104 according to the first embodiment illustrated in FIGS. 1 to 4. Therefore, explanation thereof will not be repeated.

A flow in which the film forming apparatus 101 forms a base film will be described. The film forming apparatus 101 repeatedly supplies a Ti-containing gas, an Al-containing gas, and a reaction gas into the processing container 1 to form a base film.

Figure 18:
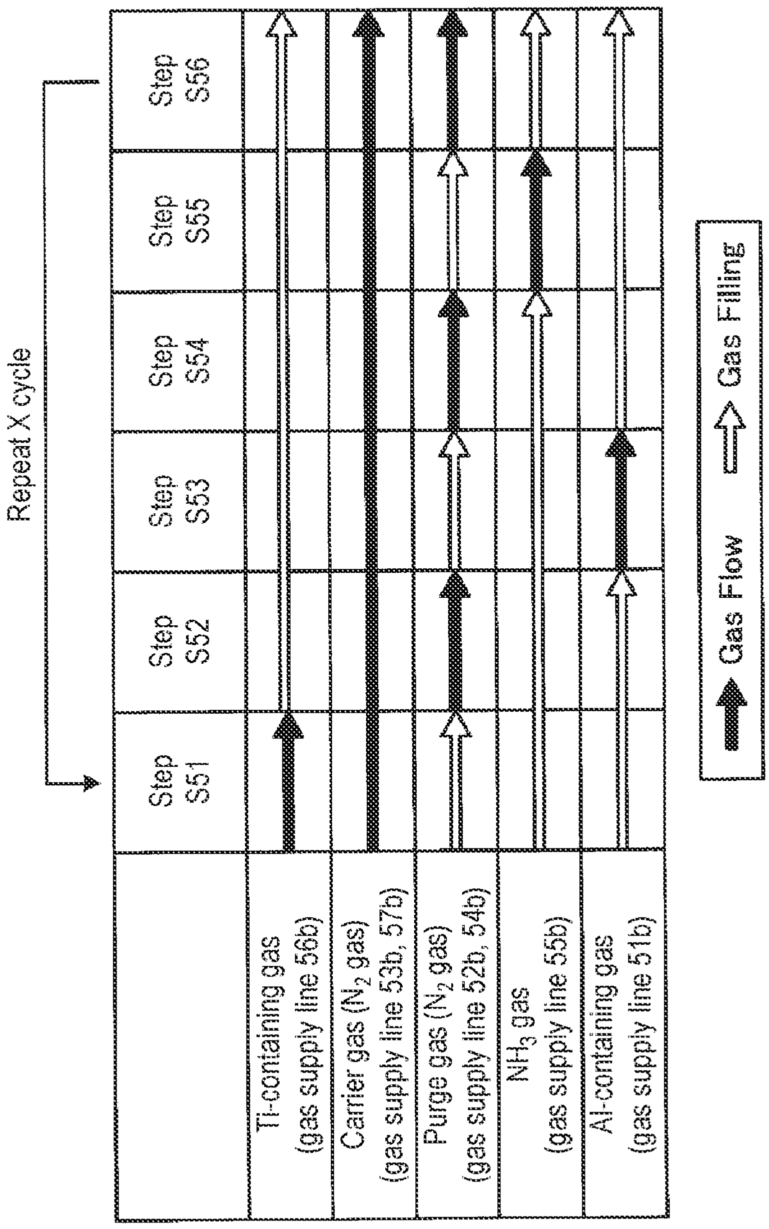
FIG. 18 is a view illustrating an example of a gas supply sequence when forming a base film according to a second embodiment.

FIG. 18 is a view illustrating an example of a gas supply sequence when forming a base film according to the second embodiment. The controller 6 opens the valves 53*e* and 57*e* to supply a predetermined flow rate of carrier gas ($N_2$ gas) from the $N_2$ gas supply sources 53*a* and 57*a* to the gas supply lines 53*b* and 57*b*, respectively. Further, the controller 6 supplies an Al-containing gas, a $N_2$ gas, an $NH_3$ gas, and a Ti-containing gas from the Al-containing gas supply source 51*a*, the $N_2$ gas supply sources 52*a* and 54*a*, the $NH_3$ gas supply source 55*a*, and the Ti-containing gas supply source 56*a* to the gas supply lines 51*b*, 52*b*, 54*b*, 55*b*, and 56*b*, respectively. At this time, since the valves 51*e*, 52*e*, 54*e*, 55*e*, and 56*e* are closed, the Al-containing gas, the $N_2$ gas, the $NH_3$ gas, and the Ti-containing gas are stored in the storage tanks 52*d*, 54*d*, 55*d*, and 56*d*, respectively, and the internal pressures of the storage tanks 52*d*, 54*d*, 55*d*, and 56*d* are increased.

The controller 6 opens the valve 56*e* to supply the Ti-containing gas stored in the storage tank 56*d* into the processing container 1 and adsorb a film by the Ti-containing gas on the surface of the wafer W (step S51).

With the lapse of a predetermined time (for example, 0.05 to 5 seconds) from the open of the valve 56*e*, the controller 6 closes the valve 56*e* to stop the supply of the Ti-containing gas into the processing container 1. Further, the controller 6 opens the valves 52*e* and 54*e* to supply the $N_2$ gas stored in the storage tanks 52*d* and 54*d* into the processing container 1, as a purge gas (step S52). At this time, since the $N_2$ gas is supplied from the storage tanks 52*d* and 54*d* in a state where the pressure is increased, the purge gas is supplied into the processing container 1 at a relatively large flow rate, for example, a flow rate larger than the flow rate of the carrier gas. Therefore, the Ti-containing gas remaining in the processing container 1 is quickly discharged to the exhaust pipe 41, so that the interior of the processing container 1 is replaced with the $N_2$ gas atmosphere from the Ti-containing gas atmosphere in a short time. Further, since the valve 56*e* is closed, the Ti-containing gas supplied from the Ti-containing gas supply source 56*a* to the gas supply line 56*b* is stored in the storage tank 56*d*, and the internal pressure of the storage tank 56*d* is increased. Further, since the valve 56*e* is closed, the carrier gas ($N_2$) supplied from the gas supply line 53*b* and the gas supply line 57*b* also functions as a purge gas to be able to discharge the excess Ti-containing gas.

With the lapse of a predetermined time (for example, 0.05 to 5 seconds) from the open of the valves 52*e* and 54*e*, the controller 6 closes the valves 52*e* and 54*e* to stop the supply of the purge gas into the processing container 1. Further, the controller 6 opens the valve 51*e* to supply the Al-containing gas stored in the storage tank 51*d* into the processing container 1 and adsorb a film by the Al-containing gas on the surface of the wafer W (step S53).

With the lapse of a predetermined time (for example, 0.05 to 5 seconds) from the open of the valve 51*e*, the controller 6 closes the valve 51*e* to stop the supply of the Al-containing gas into the processing container 1. Further, the controller 6 opens the valves 52*e* and 54*e* to supply the $N_2$ gas stored in the storage tanks 52*d* and 54*d* into the processing container 1, as a purge gas (step S54). At this time, since the $N_2$ gas is supplied from the storage tanks 52*d* and 54*d* in a state where the pressure is increased, the purge gas is supplied into the processing container 1 at a relatively large flow rate, for example, a flow rate larger than the flow rate of the carrier gas. Therefore, the Al-containing gas remaining in the processing container 1 is quickly discharged to the exhaust pipe 41, so that the interior of the processing container 1 is replaced with the $N_2$ gas atmosphere from the Al-containing gas atmosphere in a short time. Further, since the valve 51*e* is closed, the Al-containing gas supplied from the Al-containing gas supply source 51*a* to the gas supply line 51*b* is stored in the storage tank 51*d*, and the internal pressure of the storage tank 51*d* is increased. Further, since the valve 51*e* is closed, the carrier gas ($N_2$) supplied from the gas supply line 53*b* and the gas supply line 57*b* also functions as a purge gas to be able to discharge the excess Al-containing gas.

With the lapse of a predetermined time (for example, 0.05 to 5 seconds) from the open of the valves 52*e* and 54*e*, the controller 6 closes the valves 52*e* and 54*e* to stop the supply of the purge gas into the processing container 1. Further, the controller 6 opens the valve 55*e* to supply the $NH_3$ gas stored in the storage tank 55*d* into the processing container 1 to reduce the Al-containing gas and the Ti-containing gas adsorbed on the surface of the wafer W (step S55).

With the lapse of a predetermined time (for example, 0.05 to 5 seconds) from the open of the valve 55*e*, the controller 6 closes the valve 55*e* to stop the supply of the $NH_3$ gas into the processing container 1. Further, the controller 6 opens the valves 52*e* and 54*e* to supply the $N_2$ gas stored in the storage tank 52*d* into the processing container 1, as a purge gas (step S56). At this time, since the $N_2$ gas is supplied from the storage tanks 52*d* and 54*d* in a state where the pressure is increased, the purge gas is supplied into the processing container 1 at a relatively large flow rate, for example, a flow rate larger than the flow rate of the carrier gas. Therefore, the $NH_3$ gas remaining in the processing container 1 is quickly discharged to the exhaust pipe 41, so that the interior of the processing container 1 is replaced with the $N_2$ gas atmosphere from the $NH_3$ gas atmosphere in a short time. Since the valve 55*e* is closed, the $NH_3$ gas supplied from the $NH_3$ gas supply source 55*a* to the gas supply line 55*b* is stored in the storage tank 55*d*, and the internal pressure of the storage tank 55*d* is increased. Further, since the valve 55*e* is closed, the carrier gas ($N_2$) supplied from the gas supply line 53*b* and the gas supply line 57*b* also functions as a purge gas to be able to discharge the excess $NH_3$ gas.

The controller 6 repeats an X cycle of steps S51 to S55 a plurality of times (for example, 2 to 1,000 cycles) to form an AlTiN film having a desired film thickness as the base film.

Here, in the gas supply sequence shown in FIG. 18, the Ti content rate and the Al content rate can be controlled by changing the supply amount of the Ti-containing gas and the supply amount of the Al-containing gas.

It is preferable that the base film has the high Ti content rate in the lower portion on the AlO layer from the viewpoint of adhesion and reaction suppression. Further, it is preferable that the base film has the high Al content rate in the upper portion on the AlO layer from the viewpoint of easy formation and orientation of a metal layer. For example, it is preferable that the AlTiN film has the high Ti content rate in the lower portion and the high Al content rate in the upper portion.

Therefore, when forming the base film, the controller 6 adjusts the ratio of the supply amount of the Ti-containing gas and the supply amount of the Al-containing gas. This makes it possible to make gradations of element concentrations of Ti and Al for the base film. For example, the controller 6 controls so that the supply amount of Ti-containing gas is larger than the supply amount of Al-containing gas when forming the lower portion of the base film, and controls so that the supply amount of Ti-containing gas is smaller than the supply amount of Al-containing gas when forming the upper portion of the base film. For example, when forming the lower portion of the base film, the controller 6 performs one or both of a control for lengthening the supply time of Ti-containing gas and a control for shortening the supply time of Al-containing gas so that the supply amount of Ti-containing gas is larger than the supply amount of Al-containing gas. Further, when forming the upper portion of the base film, the controller 6 performs one or both of a control for shortening the supply time of Ti-containing gas and a control for lengthening the supply time of Al-containing gas so that the supply amount of Ti-containing gas is smaller than the supply amount of Al-containing gas. As a result, as illustrated in FIG. 10, the AlTiN film is formed with the high Ti content rate in the lower portion and the high Al content rate in the upper portion.

Note that the gas supply sequence and process gas conditions for forming the base film shown in FIG. 18 are examples and are not limited thereto. Other gas supply sequence and process gas conditions may be used to form the base film.

As described above, in the film forming method according to the present embodiment, the base film is formed by setting the supply amount of Ti-containing gas to be larger than the supply amount of Al-containing gas when forming the lower portion of the base film, and the supply amount of Ti-containing gas to be smaller than the supply amount of Al-containing gas when forming the upper portion of the base film, and repeatedly supplying the Ti-containing gas, the Al-containing gas, and the reaction gas in order into the processing container 1 with the purge step interposed therebetween. As a result, in the film forming method according to the present embodiment, the base film can be formed with the high Ti content rate in the lower portion and the high Al content rate in the upper portion.

Third Embodiment

Next, a third embodiment will be described. In the third embodiment, the film forming apparatus 101 is provided with the function of the film forming apparatus 102, and the film forming apparatus 102 can have the same configuration as the film forming apparatuses 103 and 104. A film forming system 100 according to the third embodiment is the same as those of the first and second embodiments and therefore, explanation thereof will not be repeated.

Figure 19:
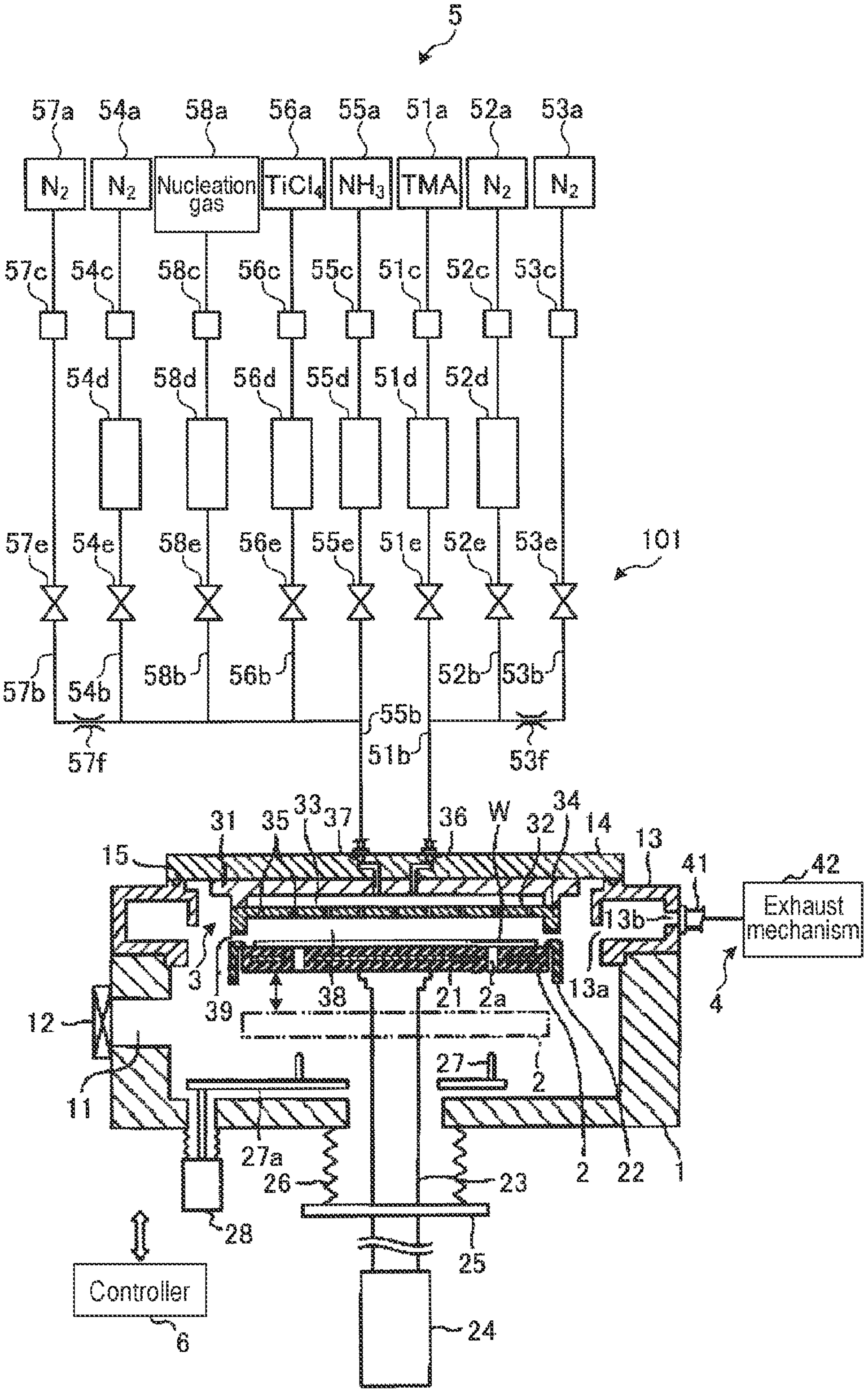
FIG. 19 is a sectional view illustrating an example of a schematic configuration of a film forming apparatus according to a third embodiment.

The configuration of the film forming apparatus 101 according to the third embodiment will be described. FIG. 19 is a sectional view illustrating an example of a schematic configuration of the film forming apparatus 101 according to the third embodiment. Since the film forming apparatus 101 according to the third embodiment has, in part, the same configuration as the film forming apparatuses 101 according to the first and second embodiments, the same parts are denoted by the same reference numerals and explanation thereof will not be repeated, and the differences will be mainly described.

The gas supply mechanism 5 further has a nucleation gas supply source 58*a* as a gas supply source for forming a base film. In the gas supply mechanism 5 shown in FIG. 19, the gas supply sources are shown separately, but they may be provided in common as long as they can be.

The nucleation gas supply source 58*a* supplies a nucleation gas for generating nuclei of a metal layer to be formed later into the processing container 1 via a gas supply line 58*b*. The nucleation gas is a gas that forms nuclei so that a metal layer can be easily formed uniformly on the wafer W. When the metal layer is a tungsten film, the nucleation gas may be a $B_2H_6$ gas, a $BCl_3$ gas, a $SiH_4$ gas, a $Si_2H_6$ gas, or a $SiH_2Cl_2$ gas. For example, the nucleation gas supply source 58*a* supplies the $B_2H_6$ gas as the nucleation gas. A flow rate controller 58*c*, a storage tank 58*d*, and a valve 58*e* are interposed in the gas supply line 58*b* from the upstream side. The downstream side of the valve 58*e* of the gas supply line 58*b* is connected to the gas supply line 55*b*. The nucleation gas supplied from the nucleation gas supply source 58*a* is temporarily stored in the storage tank 58*d* before being supplied into the processing container 1, and is supplied into the processing container 1 after being boosted to a predetermined pressure in the storage tank 58*d*. The supply and stop of the nucleation gas from the storage tank 58*d* to the processing container 1 is performed by the valve 58*e*. By temporarily storing the nucleation gas in the storage tank 58*d* in this way, the nucleation gas can be stably supplied into the processing container 1 at a relatively large flow rate.

Next, a flow in which the film forming apparatus 101 according to the third embodiment forms the base film will be described. The film forming apparatus 101 repeatedly supplies a Ti-containing gas, an Al-containing gas, and a nucleation gas into the processing container 1 to form the base film. For example, the film forming apparatus 101 forms the base film by at least once repeating a step of forming a first base film by repeating the alternating supply of Ti-containing gas and reaction gas at least once with a purge step interposed therebetween, a step of forming a second base film by repeating the alternating supply of Al-containing gas and reaction gas at least once with a purge step interposed therebetween, and a step of forming a third base film by repeating the supply of nucleation gas at least once with a purge step interposed therebetween. In the present embodiment, an AlTiBN film formed by thinly and alternately laminating a TiN film as the first base film, an AlN film as the second base film, and a B-containing film by the $B_2H_6$ gas as the third base film is formed as the base film.

Figure 20:
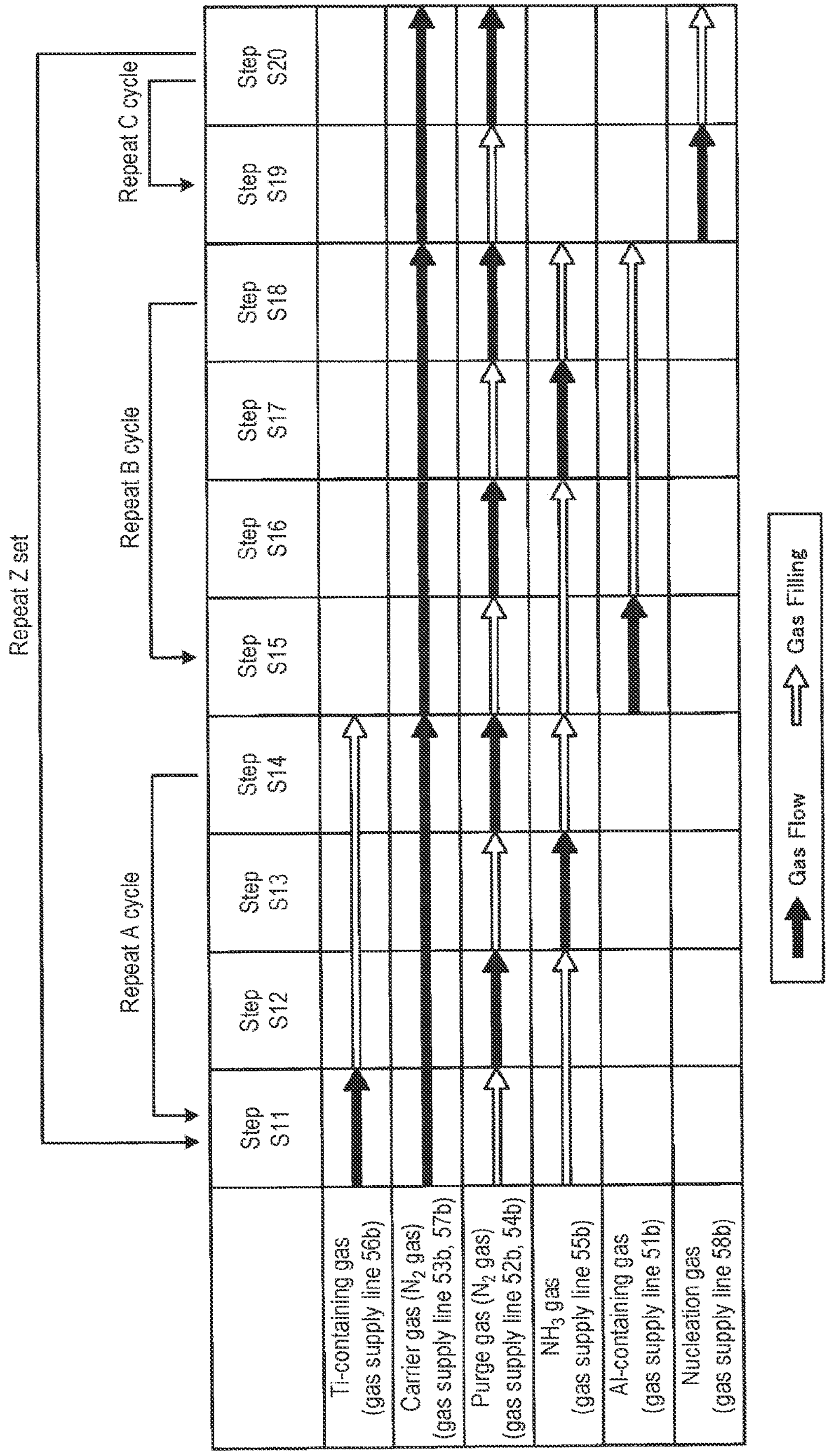
FIG. 20 is a view illustrating a gas supply sequence when forming a base film according to a third embodiment.

FIG. 20 is a view illustrating a gas supply sequence when forming the base film according to the third embodiment. Since steps S11 to S18 of the gas supply sequence shown in FIG. 20 are the same as the gas supply sequence shown in FIG. 7, explanation thereof will not be repeated.

The controller 6 opens the valves 53*e* and 57*e* to supply a predetermined flow rate of carrier gas ($N_2$ gas) from the $N_2$ gas supply sources 53*a* and 57*a* to the gas supply lines 53*b* and 57*b*, respectively. Further, the controller 6 stops the supply of the Ti-containing gas, the Al-containing gas, and the $NH_3$ gas from the Ti-containing gas supply source 56*a*, the Al-containing gas supply source 51*a*, and the $NH_3$ gas supply source 55*a*. Further, the controller 6 supplies the $N_2$ gas and the nucleation gas from the $N_2$ gas supply sources 52*a* and 54*a* and the nucleation gas supply source 58*a* to the gas supply lines 52*b*, 54*b*, and 58*b*, respectively. At this time, since the valves 52*e*, 54*e*, and 58*e* are closed, the $N_2$ gas and the nucleation gas are stored in the storage tanks 52*d*, 54*d*, and 58*d*, respectively, and the internal pressures of the storage tanks 52*d*, 54*d*, and 58*d* are increased.

With the lapse of a predetermined time (for example, 0.05 to 5 seconds) from the open of the valves 52*e* and 54*e*, the controller 6 closes the valves 52*e* and 54*e* to stop the supply of the purge gas into the processing container 1. Further, the controller 6 opens the valve 58*e* to supply the nucleation gas stored in the storage tank 58*d* into the processing container 1 to generate nuclei on the surface of the wafer W (step S9).

With the lapse of a predetermined time (for example, 0.05 to 5 seconds) from the open of the valve 58*e*, the controller 6 closes the valve 58*e* to stop the supply of the nucleation gas into the processing container 1. Further, the controller 6 opens the valves 52*e* and 54*e* to supply the $N_2$ gas stored in the storage tanks 52*d* and 54*d* into the processing container 1, as a purge gas (step S20). At this time, since the $N_2$ gas is supplied from the storage tanks 52*d* and 54*d* in a state where the pressure is increased, the purge gas is supplied into the processing container 1 at a relatively large flow rate, for example, a flow rate larger than the flow rate of the carrier gas. Therefore, the nucleation gas remaining in the processing container 1 is quickly discharged to the exhaust pipe 41, so that the interior of the processing container 1 is replaced with the $N_2$ gas atmosphere from the nucleation gas atmosphere in a short time. Since the valve 58*e* is closed, the nucleation gas supplied from the nucleation gas supply source 58*a* to the gas supply line 58*b* is stored in the storage tank 58*d*, and the internal pressure of the storage tank 58*d* is increased. Further, since the valve 58*e* is closed, the carrier gas ($N_2$) supplied from the gas supply line 53*b* and the gas supply line 57*b* also functions as a purge gas to be able to discharge the excess nucleation gas.

A C cycle of steps S19 and S20 corresponds to the step of forming the third base film.

The controller 6 forms an AlTiBN film having a desired film thickness as a base film by repeating a cycle of steps S11 to S20 a plurality of times.

Note that the gas supply sequence and process gas conditions for forming the base film shown in FIG. 20 are examples and are not limited thereto. Other gas supply sequence and process gas conditions may be used to form the base film.

Here, in the gas supply sequence shown in FIG. 20, the Ti-containing film is formed by the A cycle of steps S11 to S14, the Al-containing film is formed by the B cycle of steps S15 to S18, and the B-containing film is formed by the C cycle of steps S19 and S20. Therefore, when the base film is formed, the Ti, Al, and B content rates of the base film can be controlled by changing the number of times of performance of the A cycle, the B cycle, and the C cycle.

It is preferable that the base film has the high Ti content rate in the lower portion on the AlO layer from the viewpoint of adhesion and reaction suppression. Further, it is preferable that the base film has the high Al content rate in the middle portion on the AlO layer from the viewpoint of easy formation and orientation of a metal layer. Further, it is preferable that the base film has the high B content rate in the upper portion from the viewpoint of formation of a tungsten film. Therefore, it is preferable that the AlTiBN film has the high Ti content rate in the lower portion, the high Al content rate in the middle portion, and the high B content rate in the upper portion.

Therefore, when forming the base film, the controller 6 controls the number of executions of the step of forming the first base film, the step of forming the second base film, and the step of forming the third base film to adjust the film formation ratio of the first base film, the second base film, and the third base film. This makes it possible to make a gradation of element concentration for the base film. For example, when forming the lower portion of the base film, the controller 6 performs the step of forming the first base film more than the step of forming the second base film and the step of forming the third base film. Further, when forming the middle portion of the base film, the controller 6 performs the step of forming the second base film more than the step of forming the first base film and the step of forming the third base film. Further, when forming the upper portion of the base film, the controller 6 performs the step of forming the third base film more than the step of forming the first base film and the step of forming the second base film. From the viewpoint of adhesion to the AlO layer, it is preferable that the base film is first subjected to the A cycle. Further, from the viewpoint of easy formation, uniformity, and orientation of a metal layer, it is preferable that the base film is subjected to the C cycle at the end.

In the film forming system 100 according to the third embodiment, the wafer W on which the AlTiBN film is formed is transferred to any of the film forming apparatuses 102 to 104 and a process of forming a tungsten film is performed on the wafer W by any of the film forming apparatuses 102 to 104.

Figure 21:
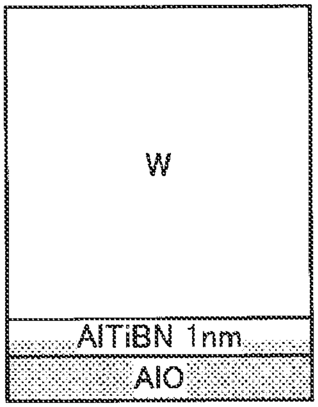
FIG. 21 is a view illustrating an example of a wafer layer configuration according to the third embodiment.

FIG. 21 is a view illustrating an example of a wafer layer configuration according to the third embodiment. FIG. 21 illustrates an example of the layer configuration of the wafer W on which a film is formed by the film forming method according to the third embodiment. In the wafer W, an AlO layer is formed for blocking on a silicon ($SiO_2$) layer (not shown). Further, in the wafer W, an AlTiBN film having a thickness of, for example, 1 nm is formed as a base film on the AlO layer by the film forming method according to the present embodiment from the viewpoint of adhesion and reaction suppression. The AlTiBN film is formed with the high Ti content rate in the lower portion, the high Al content rate in the middle portion, and the high B content rate in the upper portion. Further, in the wafer W, a low resistance tungsten film (W) is formed on the AlTiBN film.

In the layer configuration of the present embodiment, since the AlTiBN film also functions as a nucleation film, it is not necessary to forma nucleation film. As a result, in the layer configuration of the present embodiment, the tungsten film can be formed thicker by the thickness of the nucleation film, so that the resistance of the tungsten film can be reduced even when the film is thinned.

As described above, in the film forming method according to the present embodiment, in the step of forming the base film, the nucleation gas is further repeatedly supplied into the processing container 1 to form the base film. As a result, the film forming method according to the present embodiment does not require the formation of a nucleation film, so that the resistance of the tungsten film can be reduced even when the film is thinned.

Further, in the film forming method according to the present embodiment, the step of forming the base film includes at least once repeating the step of forming the first base film by repeating the alternating supply of Ti-containing gas and reaction gas at least once with the purge step interposed therebetween, the step of forming the second base film by repeating the alternating supply of Al-containing gas and reaction gas at least once with the purge step interposed therebetween, and the step of forming the third base film by repeating the supply of nucleation gas at least once with the purge step interposed therebetween. As a result, in the film forming method according to the present embodiment, the first base film, the second base film, and the third base film can be thinly and alternately laminated to form the base film, and the gradation of element concentration can be made by changing the ratio of the first base film, the second base film, and the third base film.

Although the embodiments have been described above, it should be considered that the embodiments disclosed this time are examples in all respects and are not restrictive. Indeed, the above embodiments can be embodied in a variety of forms. Moreover, the above embodiments may be omitted, replaced, or changed in various forms without departing from the claims and the gist thereof.

Figure 22:
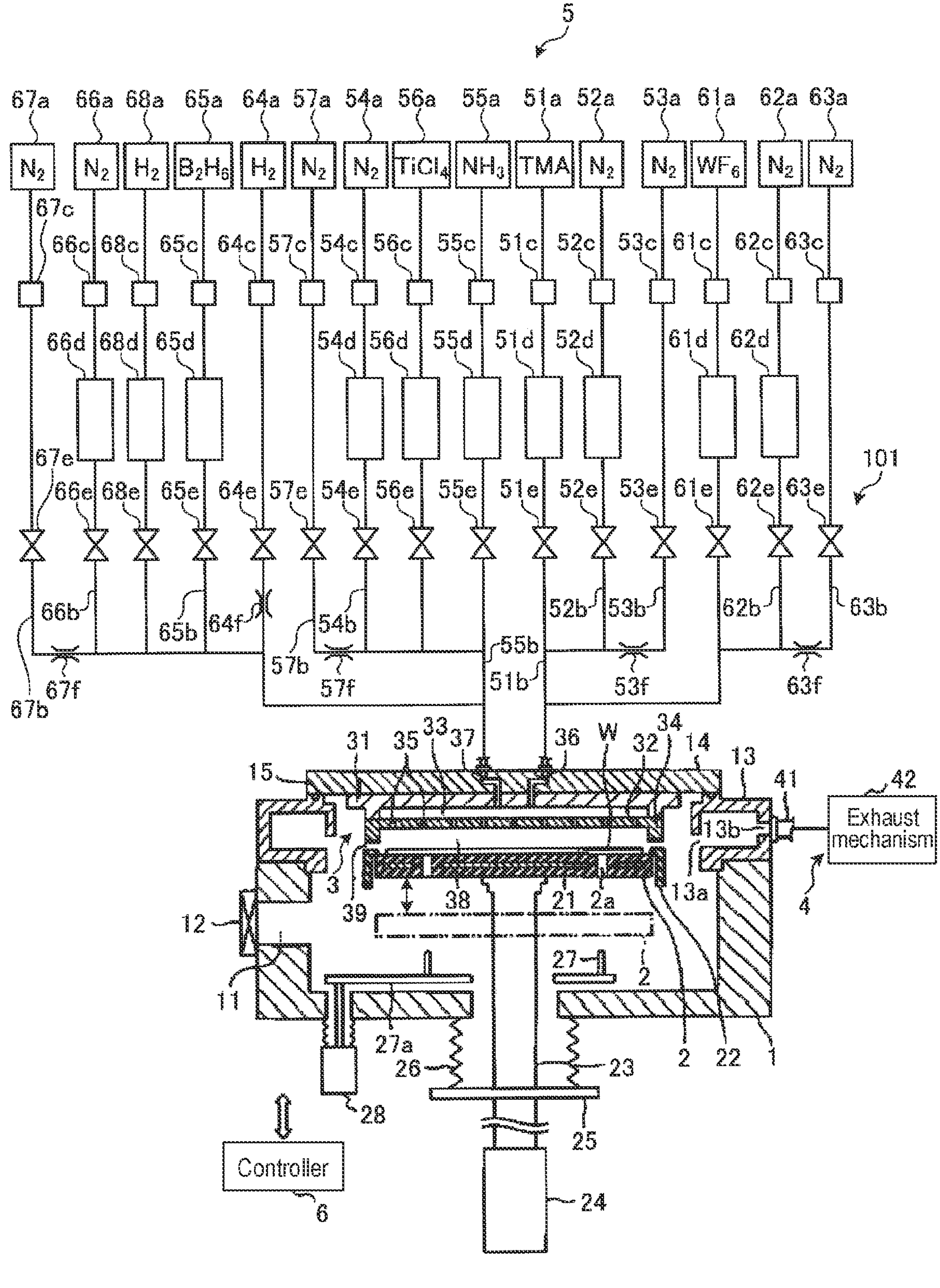
FIG. 22 is a sectional view illustrating an example of a schematic configuration of a film forming apparatus according to another embodiment.

For example, the film forming system 100 according to the embodiments has been described as an example in which the formation of the base film and the formation of the metal layer are performed by different film forming apparatuses, but the present disclosure is not limited thereto. For example, the formation of the base film and the formation of the metal layer may be performed by the same film forming apparatus. For example, in the film forming system 100, the film forming apparatuses 101 to 104 may perform the formation of the base film and the formation of the metal layer, respectively. In this case, the film forming apparatuses 101 to 104 may together have the configuration of the gas supply mechanism 5 shown in FIGS. 2 to 4. FIG. 22 is a sectional view illustrating an example of a schematic configuration of a film forming apparatus according to another embodiment. The film forming apparatus 101 illustrated in FIG. 22 has the configuration of the gas supply mechanism 5 shown in FIGS. 3 and 4 in addition to the configuration of the gas supply mechanism 5 shown in FIG. 2. In the film forming system 100, the formation of the base film and the formation of the metal layer are carried out by the film forming apparatuses 101 to 104, respectively, so that the film forming apparatus-to-film forming apparatus transfer time of the wafer W between the formation of the base film and the formation of the metal layer can be reduced, thereby improving the productivity.

Further, the film forming system 100 according to the embodiments has been described as an example in which the $NH_3$ gas is used as the reaction gas that reacts with the Ti-containing gas or the Al-containing gas when the AlTiN film or the AlTiBN film is formed, but the present disclosure is not limited thereto. For example, a hydrazine gas may be used as the reaction gas. Moreover, the $NH_3$ gas and the hydrazine gas may be used. For example, the Ti-containing gas may be reacted with the hydrazine gas to adsorb TiN on the surface of the wafer W, and the Al-containing gas may be reacted with the $NH_3$ gas to adsorb AlN on the surface of the wafer W. Further, the Ti-containing gas may be reacted with the $NH_3$ gas to adsorb TiN on the surface of the wafer W, and the Al-containing gas may be reacted with the hydrazine gas to adsorb AlN on the surface of the wafer W.

Further, the film forming system 100 according to the embodiments has been described as an example in which the $H_2$ gas is used as the reducing gas for forming the main tungsten film but the reducing gas may be any reducing gas containing hydrogen, such as a $SiH_4$ gas, a $B_2H_6$ gas, an $NH_3$ gas, or the like in addition to the $H_2$ gas. As the reducing gas for forming the main tungsten film, two or more of the $H_2$ gas, the $SiH_4$ gas, the $B_2H_6$ gas, and the $NH_3$ gas may be supplied. Further, other reducing gases other than these, such as a $PH_3$ gas and a $SiH_2Cl_2$ gas, may be used. From the viewpoint of further reducing impurities in the film to obtain a low resistance value, it is preferable to use the $H_2$ gas. Further, as the purge gas and the carrier gas, another inert gas such as an Ar gas can be used instead of the $N_2$ gas.

Further, although the semiconductor wafer has been described as an example of the substrate, the semiconductor wafer may be silicon or a compound semiconductor such as GaAs, SiC, GaN, or the like. The present disclosure is not limited to the semiconductor wafer, but may also be applied to a glass substrate, a ceramic substrate, and the like used for flat panel displays (FPDs) such as liquid crystal display devices and the like.

EXPLANATION OF REFERENCE NUMERALS

1: processing container, 5: gas supply mechanism, 6: controller, 100: film forming system, 101 to 104: film forming apparatus, W: wafer

What is claimed is:

1. A film forming method comprising:
   disposing a substrate on which an insulating film is formed in a processing container and forming a base film by repeatedly supplying a Ti-containing gas, an Al-containing gas, and a reaction gas into the processing container under a decompressed atmosphere; and
   forming a metal layer made of a metal material on the substrate on which the base film is formed,
   wherein the forming the base film comprises forming the base film by setting a supply amount of the Ti-containing gas to be larger than a supply amount of the Al-containing gas when forming a lower portion of the base film, and setting the supply amount of the Ti-containing gas to be smaller than the supply amount of the Al-containing gas when forming an upper portion of the base film,
   wherein a content rate of Al in the base film is 50% or more and less than 100%, and
   wherein the forming the base film comprises at least once repeating:
   forming a first base film by repeating an alternating supply of the Ti-containing gas and the reaction gas at least once with a purge step interposed therebetween; and
   forming a second base film by repeating an alternating supply of the Al-containing gas and the reaction gas at least once with a purge step interposed therebetween.

2. The film forming method of claim 1, wherein the Ti-containing gas comprises any of $TiCl_4$, TDMAT, and TMEAT,
   wherein the Al-containing gas comprises any of TMA and $AlCl_3$.

3. The film forming method of claim 1, wherein the forming the base film comprises forming the base film by heating a temperature of the substrate to 250 to 550 degrees C.

4. The film forming method of claim 1, wherein the forming the metal layer comprises a nucleation process of forming an initial metal film and a main process of forming a main metal film.

5. The film forming method of claim 1, wherein the metal material contains any of W, Cu, Co, Ru, and Mo.

6. The film forming method of claim 1, wherein the reaction gas is any of a N-containing gas, a rare gas, and an inert gas.

7. The film forming method of claim 1, wherein the reaction gas is any of an $NH_3$ gas and a hydrazine gas.

8. The film forming method of claim 1, wherein a film thickness of the base film is equal to or less than 3.5 nm.

9. The film forming method of claim 1, wherein the base film has a composition ratio of Ti and Al of 20 to 50%: 50 to 80%.

10. The film forming method of claim 1, wherein the base film is an amorphous film.

11. The film forming method of claim 1, wherein the insulating film is any of an AlO layer, a $SiO_2$ layer, and a SiN layer.

12. The film forming method of claim 1, wherein the forming the base film comprises:
    performing the forming the first base film more than the forming the second base film when forming the lower portion of the base film; and
    performing the forming the second base film more than the forming the first base film when forming the upper portion of the base film.

13. The film forming method of claim 1, wherein the forming the base film comprises forming the first base film first.

14. The film forming method of claim 1, wherein the forming the base film comprises forming the second base film last.

15. The film forming method of claim 1, wherein the forming the base film includes forming the base film by further repeatedly supplying a nucleation gas into the processing container.

16. The film forming method of claim 15, wherein the forming the base film comprises at least once repeating:

forming a first base film by repeating the alternating supply of the Ti-containing gas and the reaction gas at least once with a purge step interposed therebetween;

forming a second base film by repeating the alternating supply of the Al-containing gas and the reaction gas at least once with a purge step interposed therebetween; and forming a third base film by repeating a supply of the nucleation gas at least once with a purge process interposed therebetween.

* * * * *